United States Patent
Nishihara

(10) Patent No.: US 9,647,031 B2
(45) Date of Patent: May 9, 2017

(54) MEMORY DEVICE AND MANUFACTURING METHOD THEREOF

(71) Applicant: KABUSHIKI KAISHA TOSHIBA, Tokyo (JP)

(72) Inventor: Kiyohito Nishihara, Yokkaichi Mei (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 25 days.

(21) Appl. No.: 14/630,498

(22) Filed: Feb. 24, 2015

(65) Prior Publication Data
US 2016/0099209 A1     Apr. 7, 2016

(30) Foreign Application Priority Data
Oct. 3, 2014   (JP) .................... 2014-205295

(51) Int. Cl.
| | | |
|---|---|---|
| G11C 11/00 | (2006.01) | |
| H01L 27/22 | (2006.01) | |
| H01L 21/768 | (2006.01) | |
| H01L 23/522 | (2006.01) | |
| H01L 27/24 | (2006.01) | |

(52) U.S. Cl.
CPC ...... *H01L 27/222* (2013.01); *H01L 21/76805* (2013.01); *H01L 21/76831* (2013.01); *H01L 21/76877* (2013.01); *H01L 23/5226* (2013.01); *H01L 27/2481* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 8,013,317 B2 | 9/2011 | Kiyotoshi | |
| 8,553,445 B2 * | 10/2013 | Baek | G11C 5/025 |
| | | | 365/148 |
| 8,644,069 B2 | 2/2014 | Kamoshida | |
| 2011/0204309 A1 | 8/2011 | Nitta | |

* cited by examiner

*Primary Examiner* — Ali Naraghi
(74) *Attorney, Agent, or Firm* — Patterson & Sheridan, LLP

(57) ABSTRACT

A memory device includes a substrate, first and second wirings above the substrate, a third wiring above the first and second wirings, a fourth wiring above the third wiring, a first contact electrically connected between the first wiring and the fourth wiring, a first insulator on the first contact, and a second contact on the first insulator, the second contact being electrically connected between the second wiring and the third wiring. The first contact overlaps the second contact in a direction that is orthogonal to an upper surface of the substrate.

11 Claims, 17 Drawing Sheets

MEMORY DEVICE AND MANUFACTURING METHOD THEREOF

CROSS-REFERENCE TO RELATED APPLICATION

This application is based upon and claims the benefit of priority from Japanese Patent Application No. 2014-205295, filed Oct. 3, 2014, the entire contents of which are incorporated herein by reference.

FIELD

Embodiments described herein relate generally to a memory device and a manufacturing method thereof.

BACKGROUND

Recently, high integration of a semiconductor memory device is under development. As one of the methods of high integration, a three-dimensional type memory device is under development. As one of the candidates of the three-dimensional type memory device, a three-dimensional stacked layer type cross point type memory is suggested.

In this cross point type memory, it is difficult to form an interconnection region for a word line and a bit line, and a contact region of the interconnection region should be ensured. As a result, the chip area increases.

DETAILED DESCRIPTION

Embodiments provide a memory device which has a small area and a manufacturing method thereof.

In general, according to one embodiment, a memory device includes a substrate, first and second wirings above the substrate, a third wiring above the first and second wirings, a fourth wiring above the third wiring, a first contact electrically connecting the first wiring to the fourth wiring, a first insulator on the first contact, and a second contact on the first insulator, the second contact being electrically connected between the second wiring and the third wiring.

The first contact overlaps the second contact in a direction that is orthogonal to an upper surface of the substrate.

Hereinafter, an embodiment will be described with reference to the drawings.

In addition, in the description below, for convenience, a side which is close to a substrate side is referred to as a lower side.

First Embodiment

Figure 1:
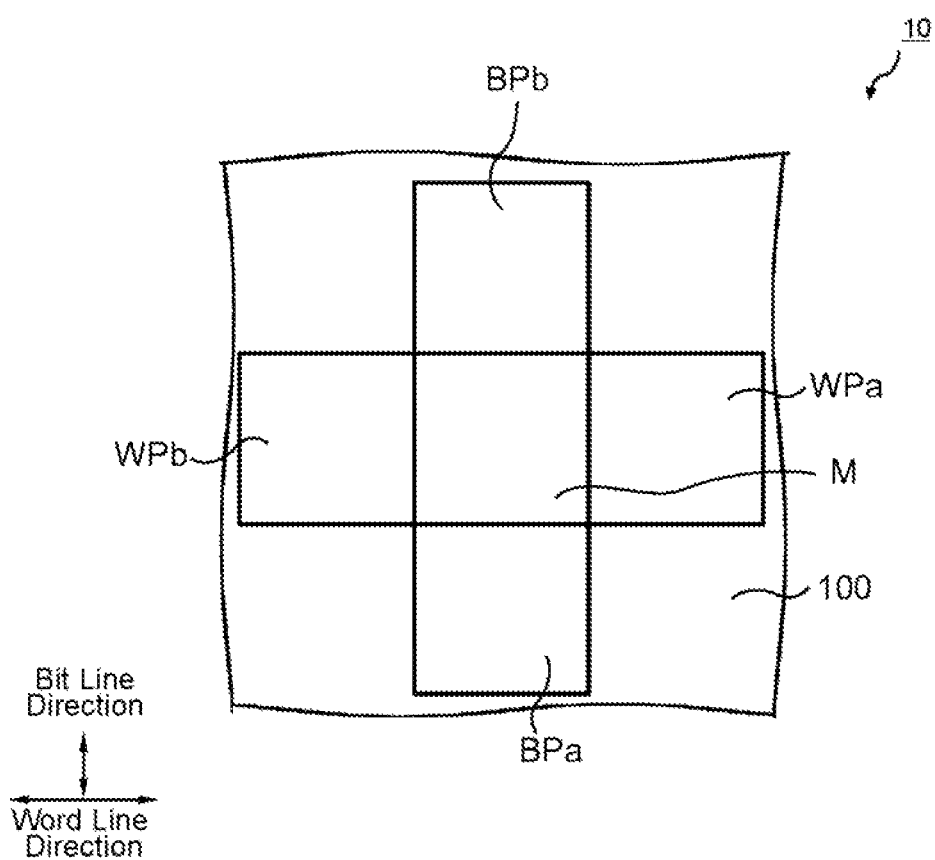
FIG. 1 is a plan view illustrating a memory cell array of a memory device according to a first embodiment.

FIG. 1 is a schematic plan view illustrating the entire memory cell array 10 of a memory device according to a first embodiment.

As illustrated in FIG. 1, a substrate (for example, silicon substrate) 100 is provided. At an upper layer part and on an upper surface of the substrate 100, a peripheral circuit (not illustrated) is formed.

Above the substrate 100, for example, a square-shaped memory unit M is provided. On a word line direction side when viewed from the memory unit M, two units, such as a word line interconnection regions WPa and WPb, are provided. In addition, on both sides in a bit line direction when viewed from the memory unit M, two units, such as a bit line interconnection regions BPa and BPb are provided.

Figure 2:
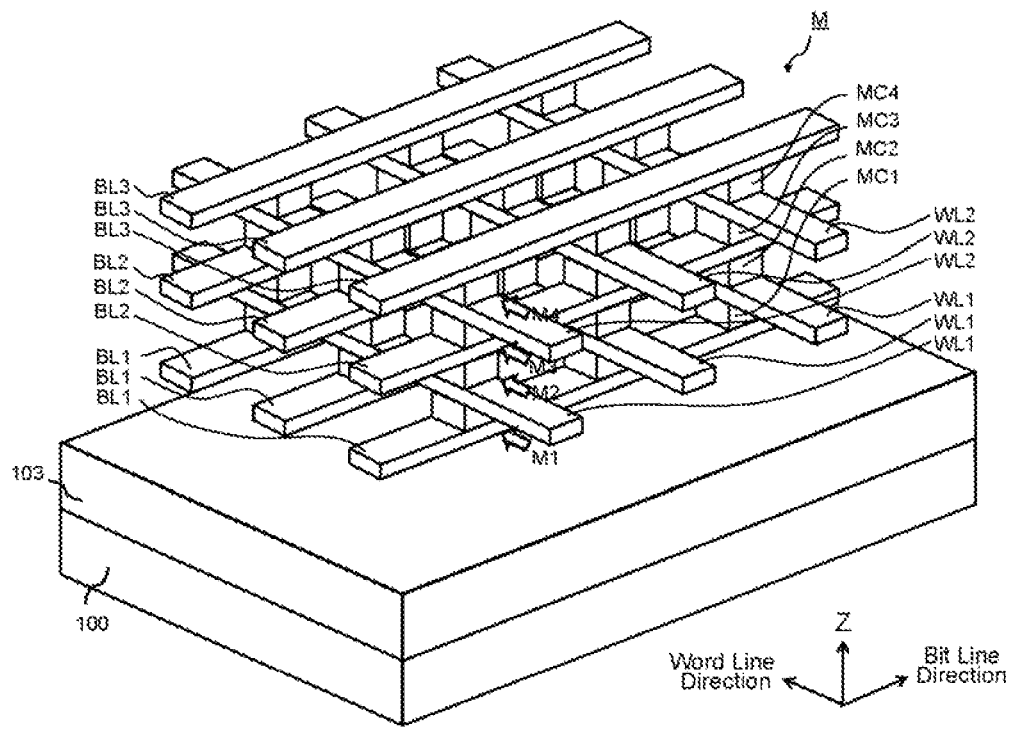
FIG. 2 is a perspective view illustrating a schematic configuration of a memory unit of the memory device according to the first embodiment.

FIG. 2 is a perspective view illustrating a basic configuration of the memory unit M of the memory cell array 10. A case where the memory unit M includes four memory cell array layers M1, M2, M3, and M4 which are stacked in a Z direction, is illustrated as an example.

On the substrate 100, from the substrate 100 side, a first bit line BL1, a first word line WL1, a second bit line BL2, a second word line WL2, and a third bit line BL3 are disposed in order. Hereinafter, the first bit line BL1, the second bit line BL2, and the third bit line BL3 may be simply referred to as a bit line BL, and the first word line WL1 and the second word line WL2 may be simply referred to as a word line WL.

In addition, the word lines WL are not connected to each other, the bit lines BL are not connected to each other, and the word line WL and the bit line BL are not connected to each other, in the memory unit M.

An extending direction of the word line WL is a "word line direction", and an extending direction of the bit line BL is a "bit line direction". In addition, a direction which is perpendicular to the upper surface of the substrate 100 is a "Z direction".

A memory cell MC is formed between the bit line and the word line. As illustrated in FIG. 2, a memory cell MC1 is formed between the first bit line BL1 and the first word line WL1. A memory cell MC2 is formed between the first word line WL1 and the second bit line BL2. A memory cell MC3 is formed between the second bit line BL2 and the second word line WL2. A memory cell MC4 is formed between the second word line WL2 and the third bit line BL3.

The memory cell array layer M1 includes a plurality of memory cells MC1 which is disposed in an array configuration in the word line direction and in the bit line direction. Similarly, the memory cell array layer M2 includes a plurality of memory cells MC2 which is disposed in an array configuration. The memory cell array layer M3 includes a plurality of memory cells MC3 which is disposed in an array configuration. The memory cell array layer M4 includes a plurality of memory cells MC4 which is disposed in an array configuration.

Hereinafter, when the memory cells MC1, MC2, MC3, and MC4 do not need to be distinguished, the memory cells are simply referred to as a memory cell MC.

Figure 3:
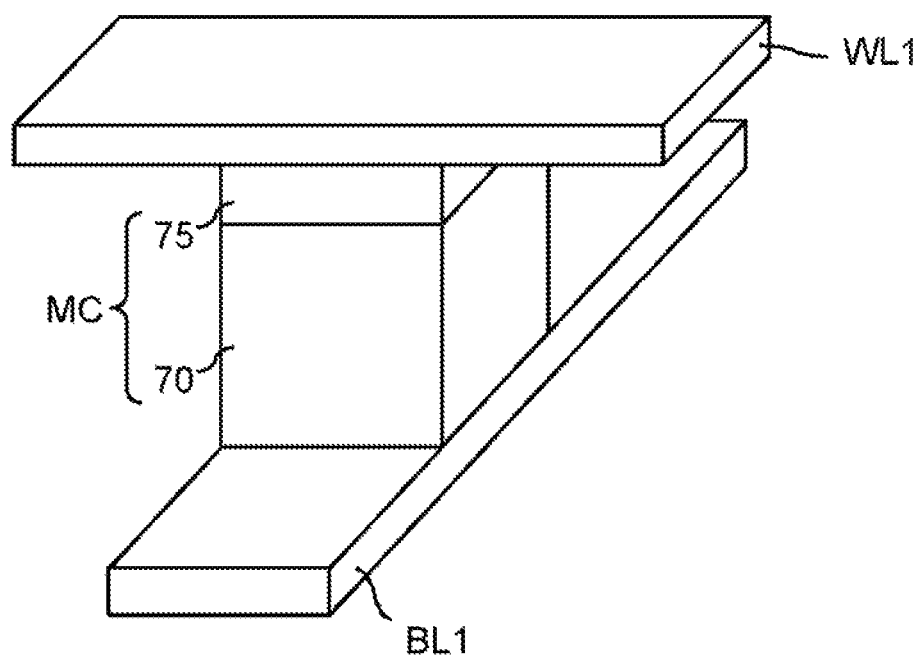
FIG. 3 is a perspective view illustrating a schematic configuration of a memory cell of the memory device according to the first embodiment.

By using FIG. 3, a basic configuration of the memory cell MC will be described. In addition, FIG. 3 illustrates the memory cell MC1 as an example of the memory cell MC.

The memory cell MC includes an element selection film 70 and a resistance change film 75 thereon. The element selection film 70 is a film which controls a flow of a current to the memory cell MC, and for example, uses a silicon diode. The resistance change film 75 is a film which uses, for example, a metal oxide, in which a filament is formed and an electric resistance value deteriorates when a voltage is applied, and in which the filament contracts and the electric resistance value increases when the voltage is applied again. In other words, a state where the electric resistance value of the resistance change film 75 is low is "0", and a state where the electric resistance value of the resistance change film 75 is high is "1". According to this, it is possible to store, for example, data of a binary value in the memory cell MC. Naturally, a state where the electric resistance value is low may be "1", and a state where the electric resistance value is high may be "0".

In addition, as the memory cell MC, a memory cell of various types of memories, such as a resistance change memory (ReRAM), a phase change memory (PCRAM), or a magnetoresistive memory (MRAM), may be used.

Figure 4:
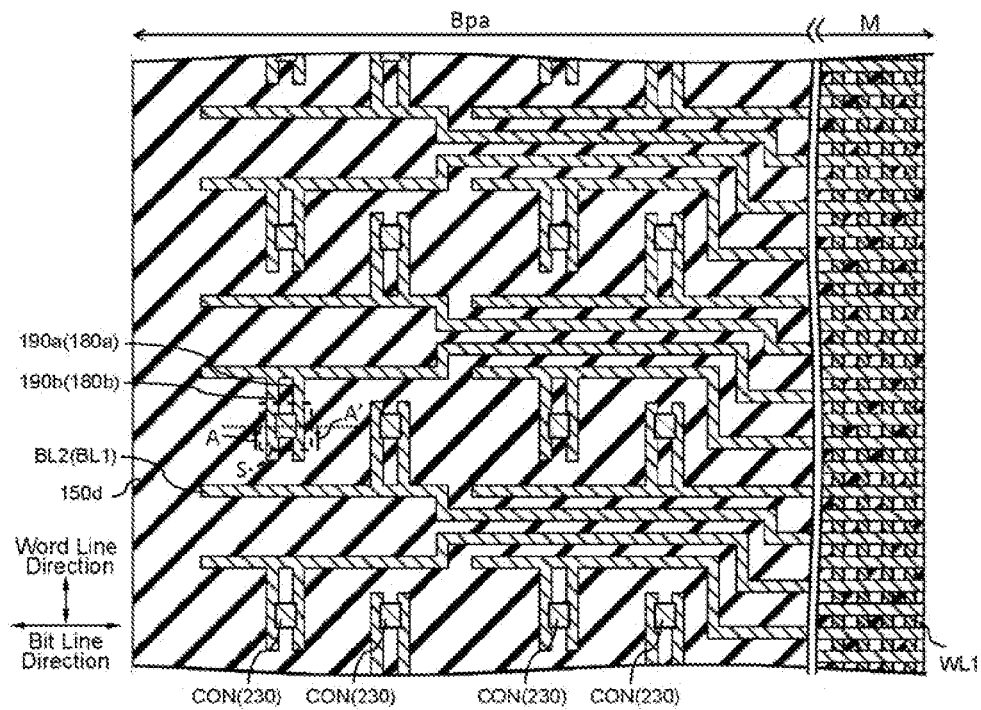
FIG. 4 is a schematic plan view illustrating a memory unit and a bit line interconnection region of the memory cell array of the memory device according to the first embodiment.

By using FIG. 4, a plane layout of the memory device according to the embodiment will be described. FIG. 4 is a plane layout after forming the second bit line BL2 and forming a connection unit CON of the first bit line BL1 and the second bit line BL2, and illustrates the memory unit M and the bit line interconnection region BPa. In addition, in order to simplify the illustration, an interlayer insulation film which is at a higher level than the first word line is transparent, and the first word line and the second bit line are shown with hatching.

With respect to the memory unit M, the bit line interconnection region BPa is provided in the bit line direction. In addition, the bit line interconnection region BPb is provided in an opposite bit line direction which is not illustrated in the drawing.

First, in the memory unit M, the first word line WL1 and the first bit line BL1 (not illustrated) intersect each other, and the first word line WL1 and the second bit line BL2 intersect each other. As described above, in this region, the memory cell MC is formed.

The second bit line BL2 is alternately drawn out to the bit line interconnection region BPa and the bit line interconnection region BPb. The second bit line BL2 which is drawn out to the bit line interconnection region BPa is drawn out as illustrated in FIG. 4.

The second bit line BL2 is provided with second bit line connection units 190a and 190b which are provided to be connected to the second bit line BL2 and extend in the word line direction. The second bit line connection units 190a and 190b are provided to be separated from each other, and a connection unit CON is provided therebetween.

In addition, the first bit line BL1 is formed by a similar pattern to that of the second bit line BL2. Similarly to the second bit line BL2, the first bit line BL1 is provided with first bit line connection units 180a and 180b which are provided to be connected to the first bit line and extend in the word line direction. The first bit line connection units 180a and 180b are provided to be separated from each other, and the connection unit CON is provided therebetween.

The connection unit CON is a region which is provided with respect to the first bit line connection units 180a and 180b, and the second bit line connection units 190a and 190b, and in which a plurality of contacts which connects the first bit line and the second bit line to different circuit elements is formed. The first bit line connection units 180*a* and 180*b* are electrically connected to circuit elements on a lower layer, such as a transistor, a diode, or a capacitor, via the connection unit CON. In another case, the second bit line connection units 190*a* and 190*b* are electrically connected to the circuit elements on a different lower layer, via the connection unit CON.

Figure 5:
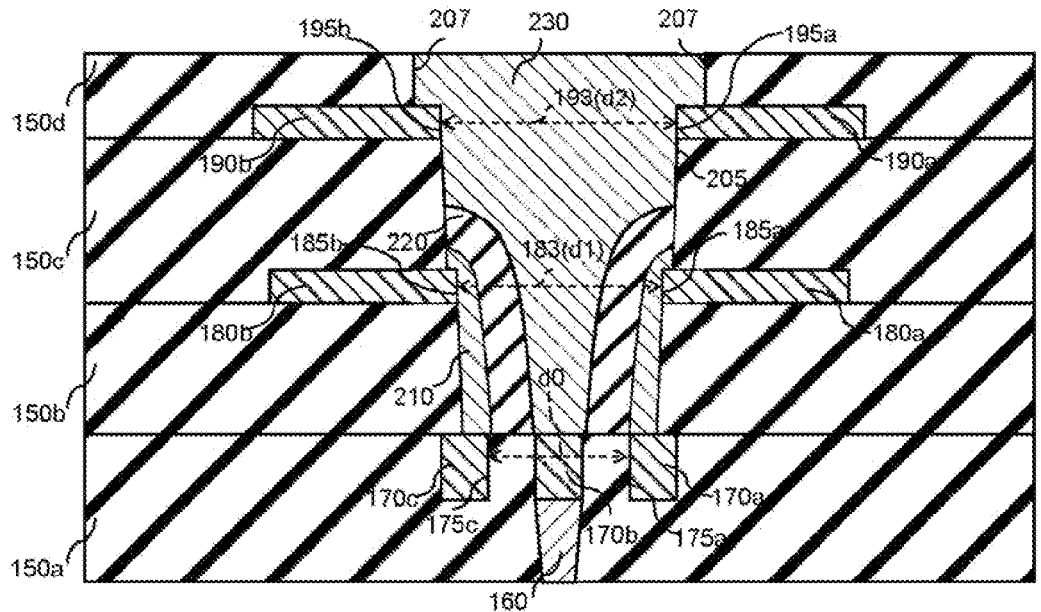
FIG. 5 is a schematic cross-sectional view illustrating a connection unit of the memory device according to the first embodiment.
Figure 6:
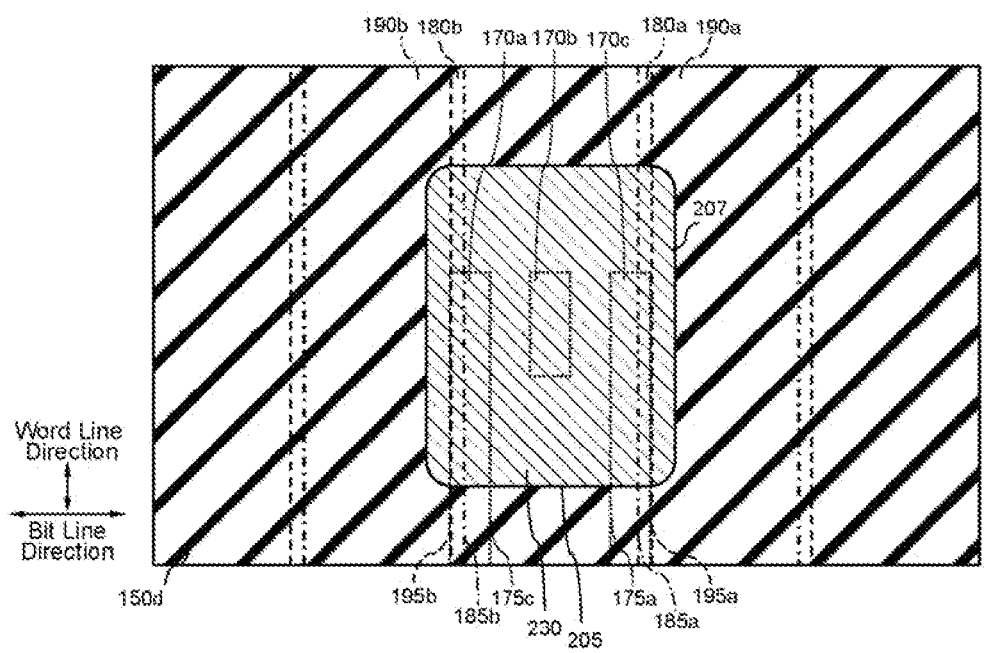
FIG. 6 is a schematic plan view illustrating the memory device according to the first embodiment.

With reference to FIGS. 5 and 6, the connection unit CON will be described in more detail. FIG. 5 is a cross-sectional view of A-A' line in FIG. 4. FIG. 6 is a plan view of a part which is considered as a region S in FIG. 4.

First, based on FIG. 5, across section will be described.

On the substrate 100 (not illustrated), an interlayer insulation film 150*a* is formed. Above the interlayer insulation film 150*a*, a lower layer contact 160 and wiring layers 170*a*, 170*b*, and 170*c* are formed in order. The wiring layers 170*a*, 170*b*, and 170*c* are simply referred to as a wiring layer 170 when they do not need to be distinguished from each other.

The wiring layer 170*b* is provided with a lower layer contact 160 at a lower side part thereof. The wiring layer 170*b* is connected to the circuit element via the lower layer contact 160.

The wiring layers 170*a* and 170*c* may be electrically connected to each other through a region which is not illustrated, and are connected to the other circuit element which is different from the circuit element to which the wiring layer 170*b* is connected.

The lower layer contact 160 and the wiring layer 170 are made of a conductive material, such as tungsten or copper.

Above the wiring layer 170, the first bit line connection units 180*a* and 180*b* are formed to be separated from each other. In other words, the first bit line connection units 180*a* and 180*b* are formed to have a first void 183 therebetween. In addition, the first void 183 is formed above the wiring layer 170. In other words, when viewed from above the first void 183, the first void 183 is formed at a position which is overlapped with the wiring layer 170.

In addition, above the first bit line connection units 180*a* and 180*b*, the second bit line connection units 190*a* and 190*b* are similarly formed to be separate from each other.

Similarly, in other words, the second bit line connection units 190*a* and 190*b* are formed to have a second void 193 therebetween. In addition, the second void 193 is formed above the first void 183 and above the wiring layer 170. In other words, when viewed from above the first void 183, the second void 193 is formed at a position which is overlapped with the first void 183. In addition, when viewed from above the first void 183, the second void 193 is formed at a position which is overlapped with the wiring layer 170.

In addition, the one which is close to the wiring layer 170*a* is considered as the first bit line connection unit 180*a* and the second bit line connection unit 190*a*. The other one is considered as the first bit line connection unit 180*b* and the second bit line connection unit 190*b*. When they do not need to be distinguished from each other, the first bit line connection unit and the second bit line connection unit are simply referred to as a first bit line connection unit 180 and a second bit line connection unit 190.

The first bit line connection unit 180 is an interconnection unit of the first bit line BL1, is a part of the first bit line BL1, and is formed of the same material as that of the first bit line BL1. Similarly, the second bit line connection unit 190 is an interconnection unit of the second bit line BL2, is apart of the second bit line BL2, and is formed of the same material as that of the second bit line BL2. In addition, as illustrated in FIG. 2, the first bit line BL1 and the second bit line BL2 are connected to the memory cell MC, and at least two memory cells MC are provided between the first bit line BL1 and the second bit line BL2.

Between the first bit line connection units 180*a* and 180*b*, and between the second bit line connection units 190*a* and 190*b*, a contact hole 205 is formed. In addition, for convenience of description, a central direction of the contact hole 205 is referred to as an inner side direction. In addition, other direction opposite to the inner side direction is called an outer side direction.

In addition, when the contact hole 205 is formed, in the wiring layer 170, the wiring layer 170*b* is very close to the center of the contact hole 205, and the wiring layers 170*a* and 170*c* are further outward than the wiring layer 170*b*.

On an outer part of the contact hole 205, a side wall contact 210 is formed. The side wall contact 210 is made of a semiconductor material, and electrically connects the first bit line connection unit 180 and the wiring layers 170*a* and 170*b* to each other. The side wall contact 210 is made of tungsten or copper.

A spacer insulation unit 220 is formed to cover the side wall contact 210 on an inner side of the contact hole 205. The spacer insulation unit 220 is made of an insulation body, and insulates the side wall contact 210 and the center contact 230. The spacer insulation unit 220 is made of a silicon oxide film, for example.

A center contact 230 is formed on the inner side of the contact hole 205, and on the inner side on which the spacer insulation unit 220 is formed. The center contact 230 is made of a semiconductor material, and electrically connects the second bit line connection unit 190 and the wiring layer 170*b*. The center contact 230 is made of tungsten, copper or the like.

In addition, for convenience of description, hereinafter, terms will be described.

First, a boundary 207 is a boundary between the center contact 230 of an upper side part of the contact hole 205 and an interlayer insulation film 150*d*.

Next, end parts 185*a* and 185*b* are inside the contact hole 205, and are referred to as end parts which faces the first bit line connection units 180*a* and 180*b*, respectively. End parts 195*a* and 195*b* are inside the contact hole 205, and are referred to as end parts which faces the second bit line connection units 190*a* and 190*b*, respectively. An end part 175*a* is below the contact hole 205, and is referred to as an end part near the wiring layer 170*b* in the wiring layer 170*a*. An end part 175*c* is below the contact hole 205, and is referred to as an end part near the wiring layer 170*b* in the wiring layer 170*c*.

Hereinafter, in particular, when they do not need to be distinguished from each other, the end parts 185*a* and 185*b* are referred to as an end part 185, the end parts 195*a* and 195*b* are referred to as an end part 195, and the end parts 175*a* and 175*b* are referred to as an end part 175.

Furthermore, a distance d0 is represents a distance on an upper part side, in particular between the wiring layers 170*a* and 170*c*, a distance d1 is represents a distance between the first bit line connection units 180*a* and 180*b*, and a distance d2 is represents a distance between the second bit line connection units 190*a* and 190*b*.

Next, by using the above-described terms, a desired relationship of each of structural will be described in a case of forming the contact hole 205, the side wall contact 210, or the center contact 230 in self-alignment. In addition, self-alignment forming method will be described in the description of a manufacturing method.

In other words, (1) it is desirable that a part of the boundary 207 be formed above the second bit line connection unit 190. (2) It is desirable that the end part 195 be formed on the first bit line connection unit 180. (3) It is desirable that the end part 185 be formed on the outer side of the end part 175. (4) It is desirable that the distance d2 be larger than the distance d1, and the distance d1 be larger than the distance d0.

In addition, the contact hole 205, the side wall contact 210, the center contact 230, or the like may be partially formed in self-alignment. In other words, the contact hole 205 or the like may be partially formed in self-alignment unintentionally by misalignment or the like, and only a partial region thereof may be formed in self-alignment intentionally.

Accordingly, it is not required that the relationship in the above-described (1) to (4) be valid in the entire region in which the contact hole 205 is formed. It is sufficient if the above-described relationship is valid at a part of the region in which the contact hole 205 is formed. In addition, it is not necessary to satisfy all of the conditions at the same time.

If the above-described relationship is partially valid even at part thereof, this is because the contact hole 205, the side wall contact 210, the center contact 230, or the like may be formed in self-alignment at this part.

As a specific example, the following relationships may be employed. (1)' The boundary 207 is formed above one of the second bit line connection unit 190a or the second bit line connection unit 190b. (2)' The end part 195a is formed on the first bit line connection unit 180a. (3)' The end part 185a is formed in the outer side direction of the end part 175a. Even in this case, the contact hole 205 may be partially formed in self-alignment.

FIG. 6 is a plan view that provides an enlarged view of a region S in FIG. 4. In addition, the first bit line connection units 180a and 180b, the second bit line connection units 190a and 190b, and the wiring layers 170a, 170b, and 170c are illustrated by dotted lines.

The first bit line connection units 180a and 180b are separated from each other, and are provided to extend in the word line direction. In addition, as illustrated in FIG. 4, the first bit line connection units 180a and 180b are connected to the first bit line BL1 (not illustrated) at an upper part of the drawing.

The second bit line connection units 190a and 190b are separated from each other, and are provided to extend in the word line direction. In addition, as illustrated in FIG. 4, the second bit line connection units 190a and 190b are connected to the second bit line BL2 (not illustrated) at the upper part of the drawing.

The wiring layers 170a, 170b, and 170c are provided to be separated from each other. The wiring layers 170a and 170c are drawn out to a lower side in the drawing. In addition, as described above, the wiring layer 170b is drawn out by the lower layer contact 160 which is not illustrated. The drawn-out wiring layers 170a, 170b, and 170c are connected to the circuit element, such as a transistor, or other lower layer wiring. In addition, as described above, the wiring layers 170a and 170c may be connected to each other.

The side wall contact 210 which is not illustrated is formed to cover the end part of the first bit line connection unit 180a, and the first bit line connection unit 180b and the wiring layers 170a and 170c are conducted to each other.

The center contact 230 is formed to cover the end part of the second bit line connection unit 190a, and the second bit line connection unit 190b and the wiring layer 170b are conducted to each other.

Hereinafter, a method of manufacturing a memory device 5 according to the first embodiment will be described with reference to FIGS. 7 to 17. In addition, since formation of the memory cell MC may be appropriately performed in the middle of the process as necessary, the description thereof will be omitted.

Figure 7:
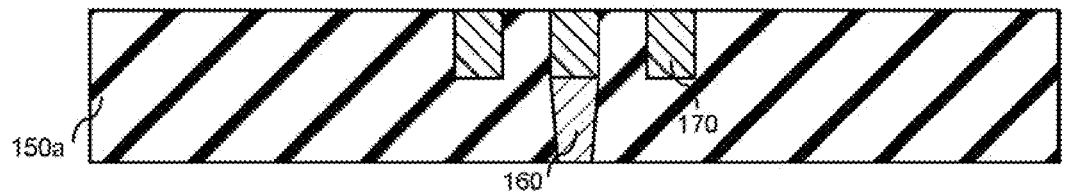
FIG. 7 is a schematic cross-sectional view illustrating a step in the method of manufacturing the memory device according to the first embodiment.

As illustrated in FIG. 7, the interlayer insulation film 150a is formed on a substrate (not illustrated) on which the circuit element (not illustrated), such as the transistor, is formed. The interlayer insulation film 150a is a silicon oxide film, for example.

The lower layer contact 160 and the wiring layer 170 are formed in the interlayer insulation film 150a. The lower layer contact 160 or the wiring layer 170 is made of, for example, a barrier metal film and a metal layer. The barrier metal film is made of titanium, tantalum, titanium nitride, tantalum nitride, or a laminated layer thereof. The metal layer is made of tungsten, copper or the like.

Figure 8:
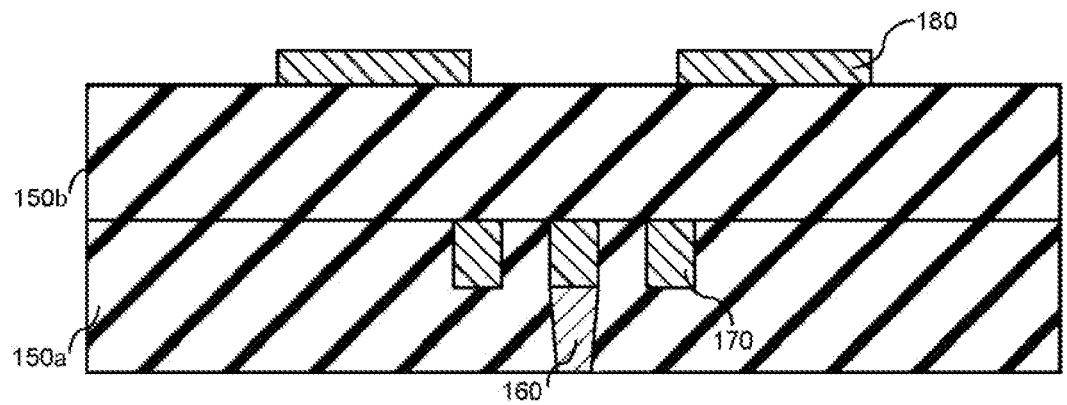
FIG. 8 is a schematic cross-sectional view illustrating a step in the method of manufacturing the memory device according to the first embodiment.

Next, as illustrated in FIG. 8, an interlayer insulation layer 150b is formed. As necessary, a chemical mechanical polishing (CMP) process or the like, such as flattening, may be performed. Furthermore, above the interlayer insulation layer 150b, after forming a film made of a material, by a mask pattern forming and reactive ion etching (RIE) according to a lithography method, the first bit line connection unit 180 is formed with a void. The first bit line connection unit 180 may use a similar material to that of the wiring layer 170.

Figure 9:
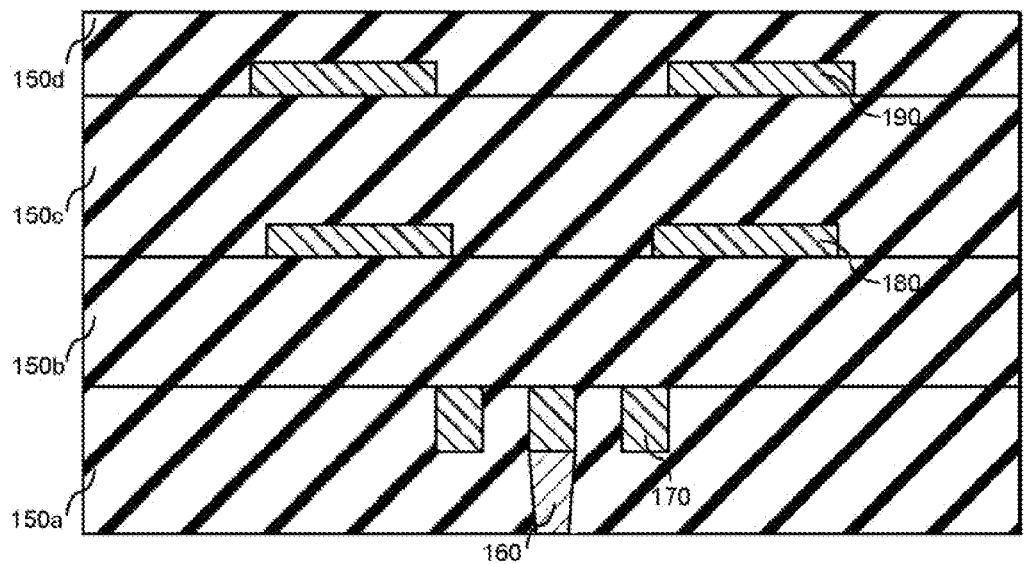
FIG. 9 is a schematic cross-sectional view illustrating a step in the method of manufacturing the memory device according to the first embodiment.

Next, as illustrated in FIG. 9, an interlayer insulation layer 150c is formed, and the second bit line connection unit 190 is formed with a void on the interlayer insulation layer 150c. These forming methods are similar to forming methods of the interlayer insulation layer 150b and the first bit line connection unit 180. Furthermore, the interlayer insulation film 150d is formed.

Figure 10:
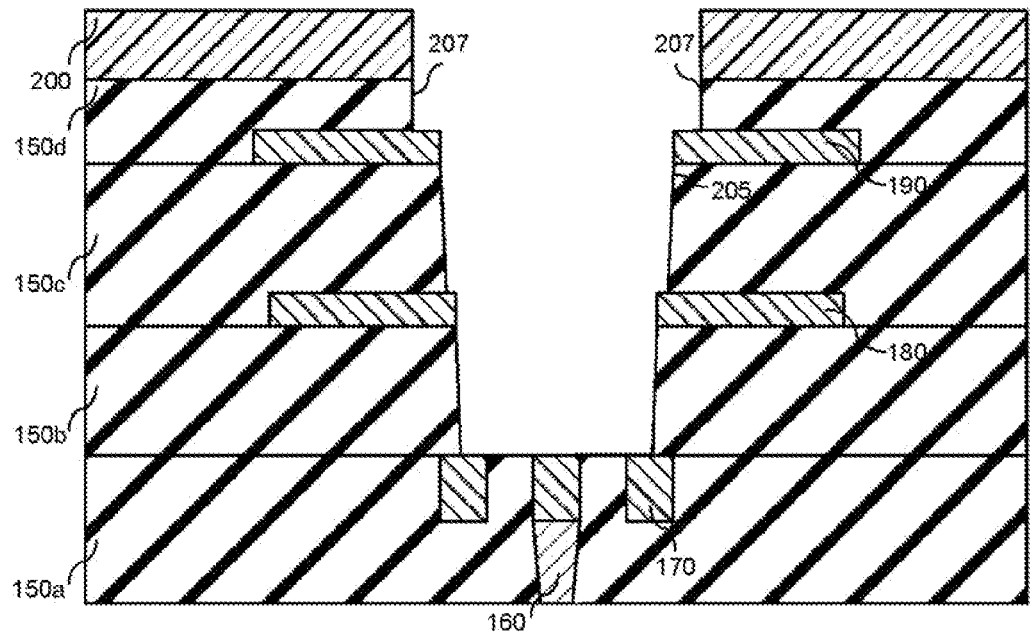
FIG. 10 is a schematic cross-sectional view illustrating a step in the method of manufacturing the memory device according to the first embodiment.

Next, as illustrated in FIG. 10, using a lithography method or the like, a mask pattern 200 is formed. By using the mask pattern 200 as a mask, an etching process is performed until the wiring layer 170 is exposed by the RIE method. By the etching process, the contact hole 205 is provided in the void between the first bit line connection unit 180 and the second bit line connection unit 190. This state is illustrated in FIG. 10. In addition, in practice, the interlayer insulation film 150a is also etched to a certain extent by the above-described etching process, but the description thereof will be omitted in FIG. 10.

It is desirable that the mask pattern 200 be formed so that a part of the boundary 207 of the interlayer insulation film 150d after the etching process is formed above the second bit line connection unit. Because a size of an opening of the mask pattern 200 widens after the etching process, the mask pattern 200 may be formed in consideration of the widening size.

In addition, the above-described etching uses an etching condition in which an etching speed of the interlayer insulation films 150a to 150d is faster than an etching speed of the first bit line connection unit 180 and the second bit line connection unit 190.

When selecting the etching condition, as illustrated in FIG. 10, during the etching of a layer below the second bit line connection unit 190, the second bit line connection unit 190 functions as a mask. In other words, the interlayer insulation layer 150c below the second bit line connection unit 190 is almost not etched. In addition, similarly, during the etching of a layer below the first bit line connection unit 180, the first bit line connection unit 180 functions as a mask.

In this manner, based on a shape of the first bit line connection unit 180 and the second bit line connection unit 190, a shape of the contact hole 205 below the second bit line connection unit 190 is formed. In other words, it is possible to reduce an influence of the mask pattern 200 of the lithography or an unevenness in the etching process. In this manner, by a structure which has been already formed, such as the first bit line connection unit 180 and the second bit line connection unit 190, the contact hole 205 is formed in a continuous shape in self-alignment.

Figure 11:
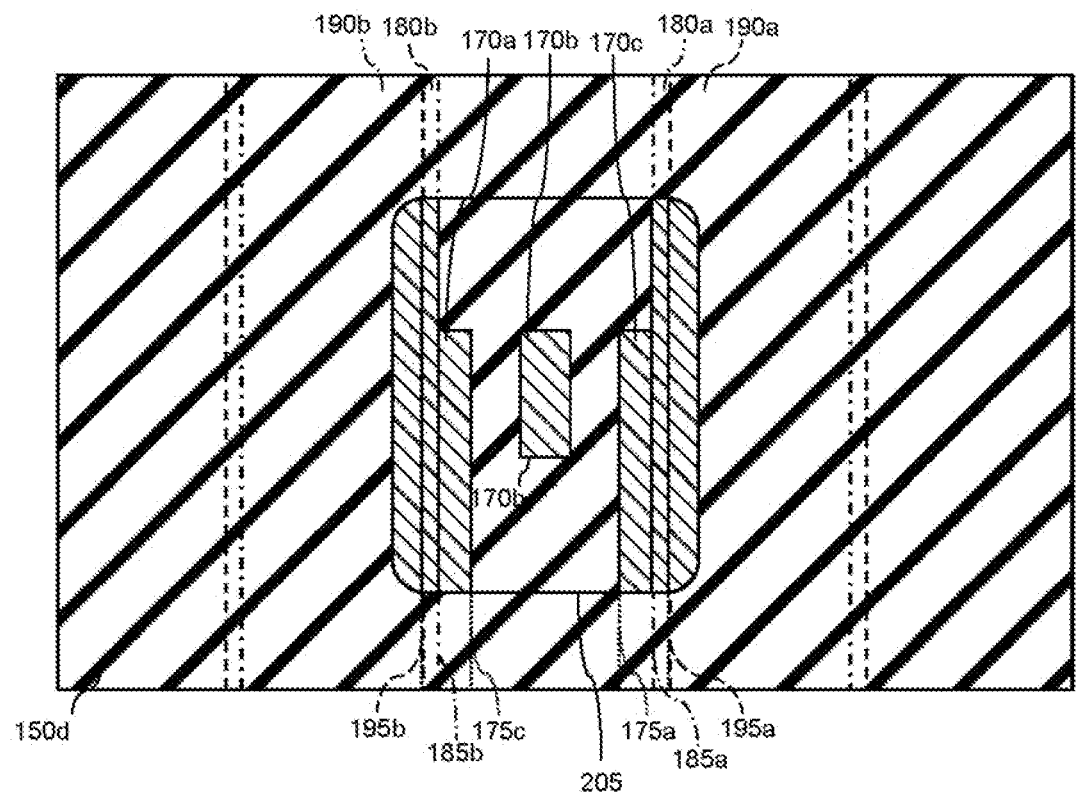
FIG. 11 is a schematic plan view illustrating a step in the method of manufacturing the memory device according to the first embodiment.

A plan view after the contact hole 205 is formed is illustrated in FIG. 11. In addition, in FIG. 11, the first bit line connection unit 180, the second bit line connection unit 190, and the wiring layer 170 are illustrated by dotted lines.

As illustrated in FIG. 11, inside the contact hole 205, the wiring layer 170, the first bit line connection unit 180, and the second bit line connection unit 190 are exposed. In addition, the wiring layers 170*a* and 170*b* of both ends of the wiring layer 170 are drawn out to the lower side in the drawing.

Figure 12:
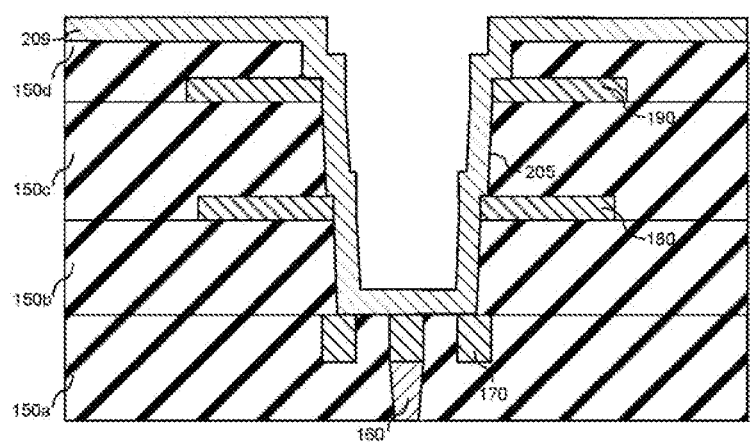
FIG. 12 is a schematic cross-sectional view illustrating a step in the method of manufacturing the memory device according to the first embodiment.

Next, as illustrated in FIG. 12, a side wall contact material 209 is formed. The side wall contact material 209 employs a film forming method that produces excellent coverage, and thus it is possible to form a film even on the side wall of the contact hole 205. The side wall contact material 209 is made of, for example, a barrier metal film and a metal film. The barrier metal film is made of titanium, tantalum, titanium nitride, tantalum nitride, or the laminated layer thereof. The metal layer is made of tungsten or the like.

Figure 13:
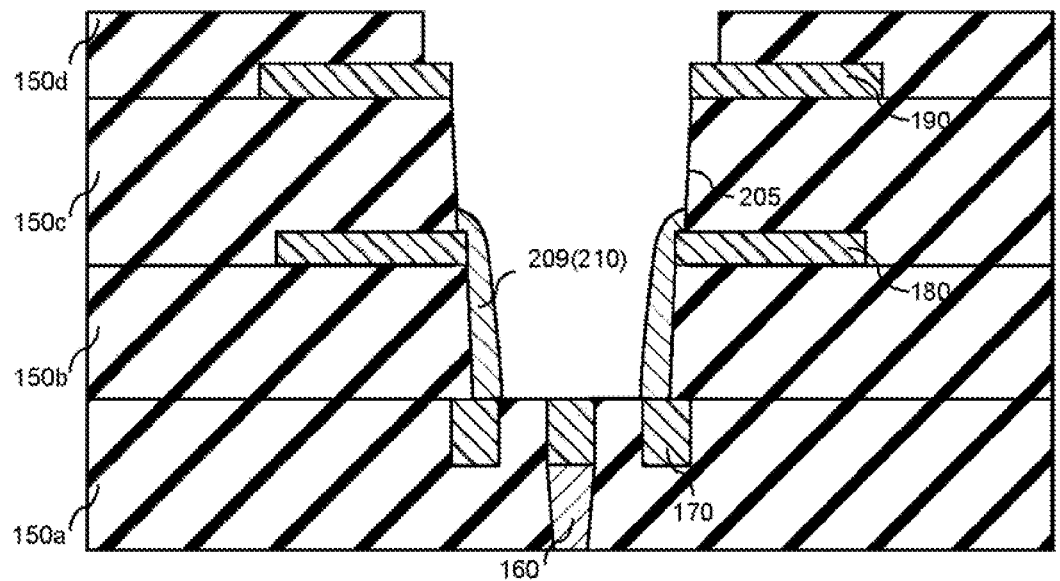
FIG. 13 is a schematic cross-sectional view illustrating a step in the method of manufacturing the memory device according to the first embodiment.

Next, as illustrated in FIG. 13, the entire surface of the side wall contact material 209 is etched back by anisotropic etching, such as the RIE method. Accordingly, the side wall contact 210 is formed. This etching back is performed under time control, for example.

By etching back, the side wall contact material 209 is removed from a region on the interlayer insulation film 150*d*, a region which is in contact with the second bit line connection unit 190, and a region of the upper layer of the wiring layer 170*b*. In addition, etching back is performed so that the side wall contact material 209 remains at least at a part of a region in which the first bit line connection unit 180 is exposed to the inside of the contact hole 205, at the side wall of the interlayer insulation layer 150*b*, and at least at a part of a region in which the wiring layers 170*a* and 170*c* are exposed to the inside of the contact hole 205. As illustrated in FIG. 13, it is desirable that the side wall contact material 209 remain to cover a region in which the first bit line connection unit 180 is exposed to the inside of the contact hole 205.

Figure 14:
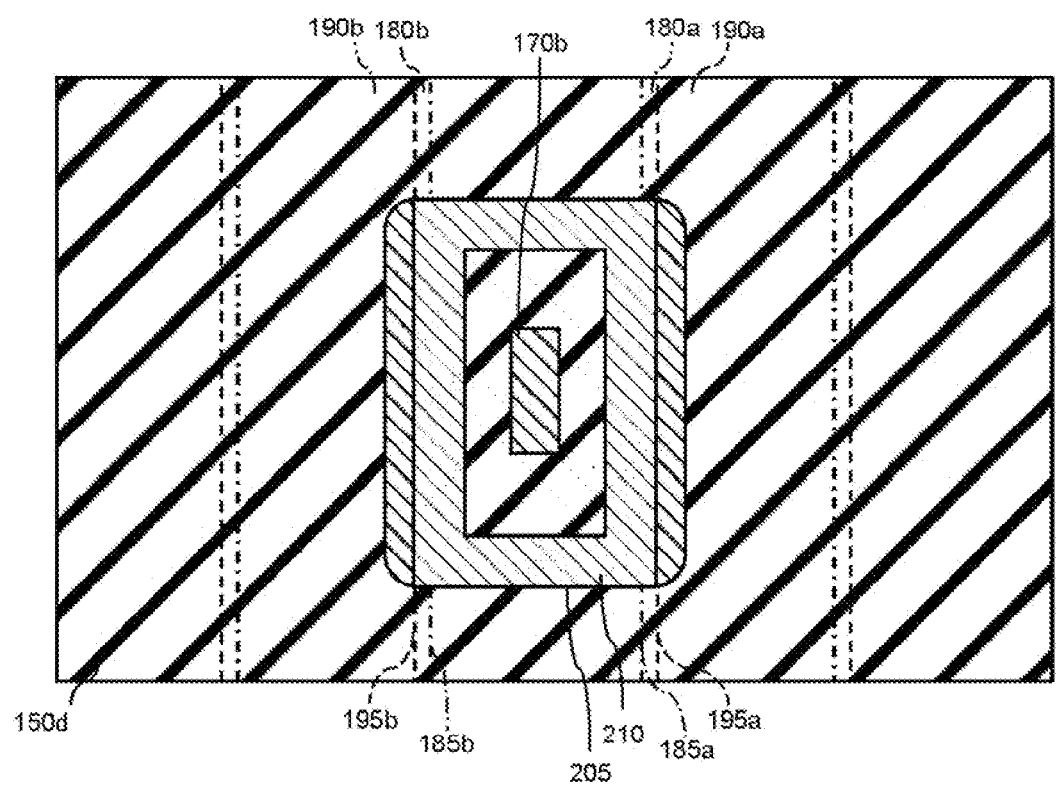
FIG. 14 is a schematic plan view illustrating a step in the method of manufacturing the memory device according to the first embodiment.

The side wall contact 210 is formed on the side walls of the first bit line connection unit 180 and the interlayer insulation layer 150*b*. A plan view of this state is illustrated in FIG. 14.

Figure 15:
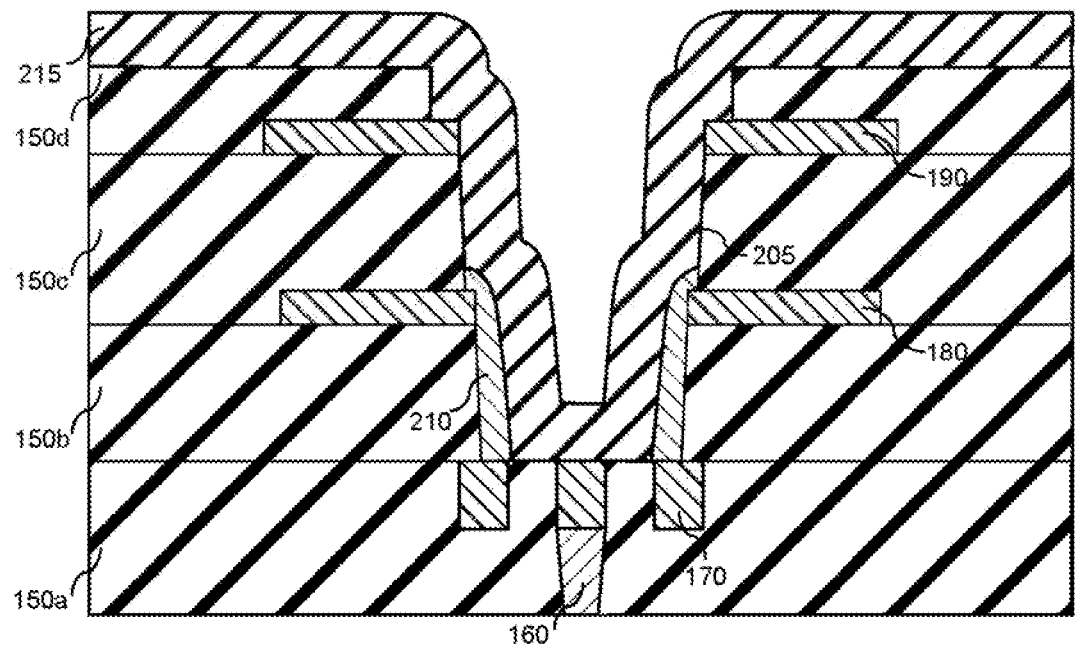
FIG. 15 is a schematic cross-sectional view illustrating a step in the method of manufacturing the memory device according to the first embodiment.
Figure 16:
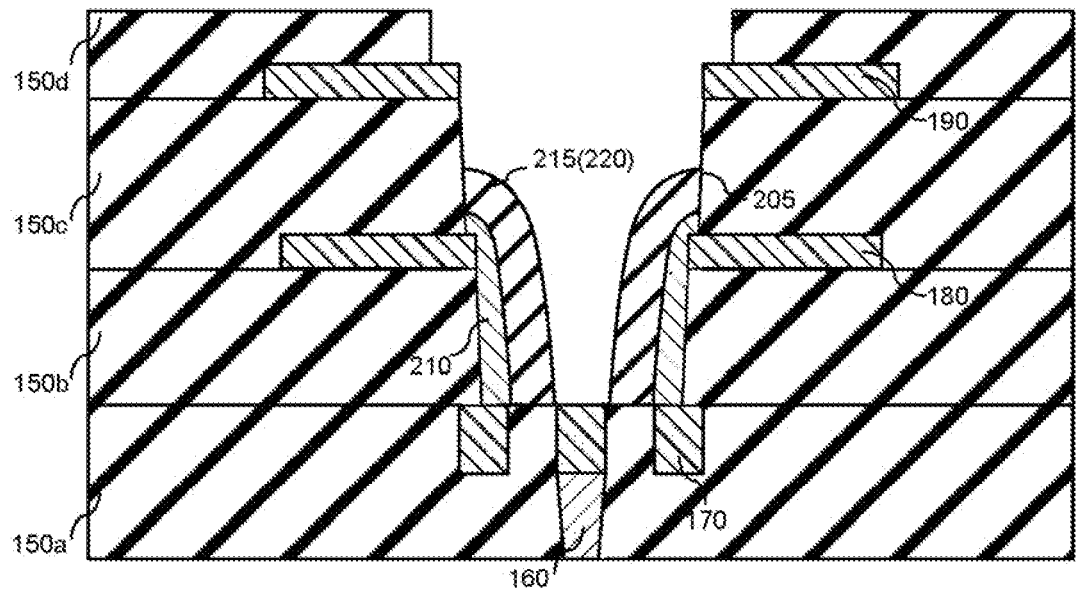
FIG. 16 is a schematic cross-sectional view illustrating a step in the method of manufacturing the memory device according to the first embodiment.

Next, as illustrated in FIG. 15, a spacer insulation material 215 is formed. The spacer insulation material 215 uses, for example, a silicon oxide film Next, as illustrated in FIG. 16, the entire surface of the spacer insulation material 215 is etched back by the anisotropic etching, such as the RIE method. Accordingly, the spacer insulation unit 220 is formed. This etching back is performed under time control, for example. In addition, a change in luminous intensity from active species or an ion in a plasma by the exposure of the wiring layer 170*b* may be detected and controlled.

By etching back, the spacer insulation material 215 is removed from a region on the interlayer insulation film 150*d*, a partial region of a region in which the second bit line connection unit 190 is exposed to the inside the contact hole 205, and a partial region on the wiring layer 170*b*. In addition, in order to insulate the side wall contact 210 and the center contact which is formed later, the spacer insulation material 215 remains to cover the side wall contact 210. As illustrated in FIG. 16, it is desirable that the spacer insulation material 215 be removed from the entire region in which the second bit line connection unit 190 is exposed to the inside of the contact hole 205 until a height in the middle of the interlayer insulation layer 150*c*.

Figure 17:
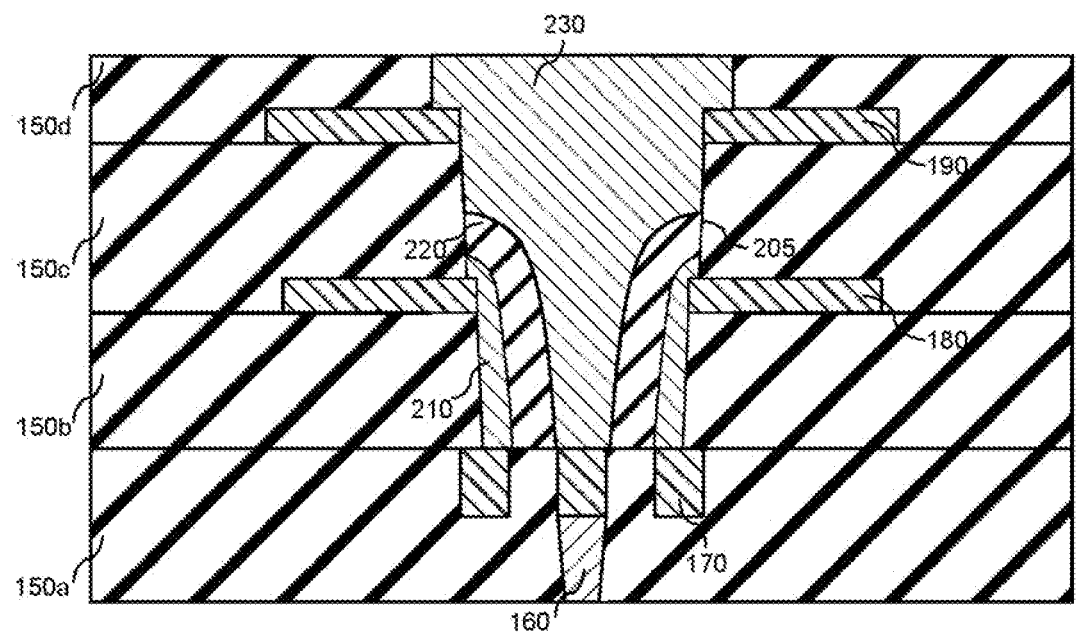
FIG. 17 is a schematic cross-sectional view illustrating a step in the method of manufacturing the memory device according to the first embodiment.

Next, as illustrated in FIG. 17, the center contact 230 is formed. A center contact material is formed, and flattening is performed by the CMP. By the CMP, as the center contact material on the interlayer insulation film 150*d* is removed, the center contact 230 is formed.

Hereinafter, by a standard manufacturing method, the memory device according to the embodiment is manufactured.

In the memory device according to the embodiment, as the connection unit CON is provided, with respect to each of the first bit line BL1 and the second bit line BL2 in the same region, it is possible to form the contact to each of the different circuit elements. As compared to a case where the connection units of the first bit line BL1 and the second bit line BL2 are separately formed, it is possible to reduce the area required for the connection unit, and to reduce the area of the memory device.

In addition, it is possible to form the connection unit CON by forming a mask pattern and by a following process. As compared to a case where the connection to the wiring layers 170 of the first bit line BL1 and the second bit line BL2 is separately formed, it is possible to manufacture the device with a reduced number of processes.

Specifically, when each of the connections is separately formed, at least two times of mask pattern forming processes, two times of processing processes, two times of film-forming processes of a conductive material, and two times of CMP processing processes, are required. With respect to this, in the embodiment, for example, one time of mask pattern forming process, two times of processing processes, two times of film-forming processes of the conductive material, one time of film-forming process of an insulation film material, and one time of CMP processing process, are required. In other words, the number of the mask pattern forming process and the CMP processing process is one time less, and instead, the number of film-forming process of the insulation film material is one time more. In other words, at least one time of process is less in the embodiment. Less number of processes reduces the cost and contributes to improving yield. Furthermore, there are many cases where the cost of the lithography process of mask pattern forming and the CMP process is lower than the cost of the insulation film material forming.

Hereinafter, a modification example of the first embodiment will be described.

Figure 18:
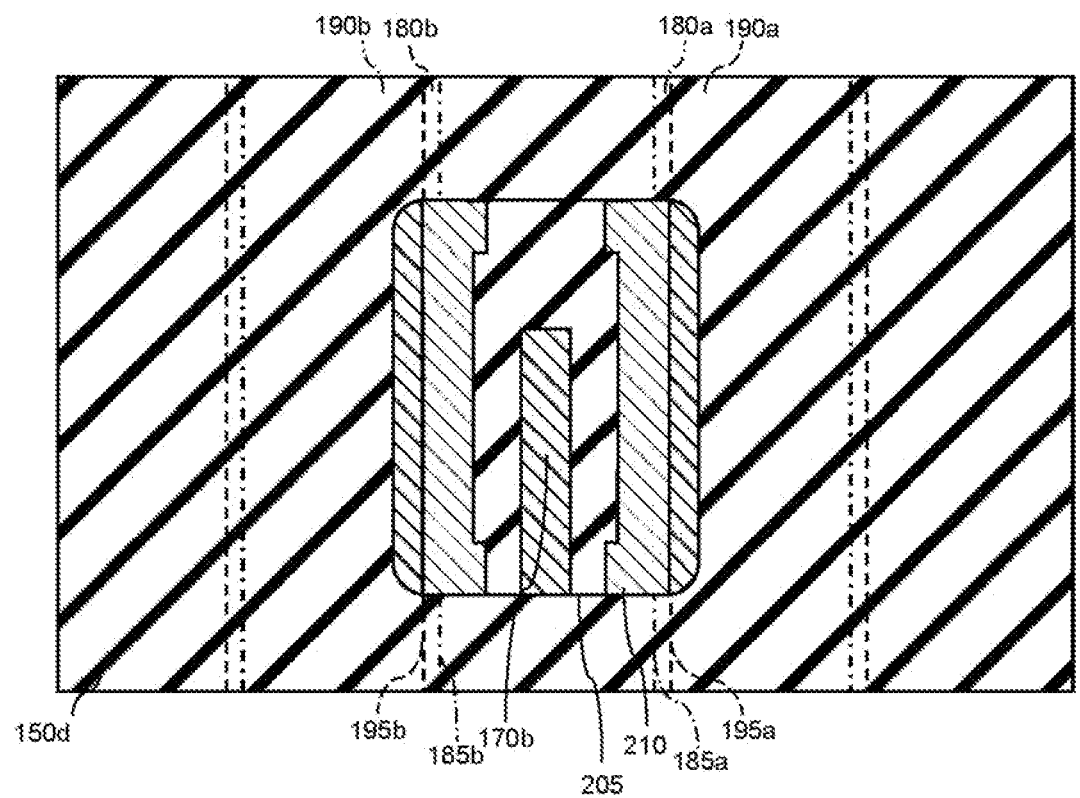
FIG. 18 is a schematic plan view illustrating a step in the method of manufacturing the memory device according to the first embodiment.

The process illustrated in FIGS. 13 and 14 is similarly performed until forming the side wall contact 210. After this, as illustrated in FIG. 18, the side wall contact 210 is divided into two on the first bit line connection units 180*a* and 180*b*. In other words, in the side wall contact 210, a partial region in which the side wall contact 210 is not formed along the first bit line connection unit 180 and the second bit line connection unit 190 is removed. In addition, the above-described division forms a mask by the lithography method, for example, and may perform etching by the RIE method.

Accordingly, with respect to the wiring layer 170b, without providing the lower layer contact 160, it is possible to draw out the wiring layer 170b to the other circuit element or the like.

Another modification example will be described. An example in which there are three wiring layers 170 is illustrated in FIG. 5, but two wiring layers 170 may be provided. For example, only the wiring layers 170a and 170b may be provided. In this case, the first bit line BL1 is drawn out to the wiring layer 170a, and the second bit line BL2 is drawn out to the wiring layer 170b.

In addition, still another modification example will be described. In FIG. 2, an example in which the memory cell MC includes the element selection film 70 that uses the silicon diode and the resistance change film 75 that uses the metal oxide material is illustrated, but the embodiment is not limited thereto. For example, the element selection film 70 may not be provided. In addition, the resistance change film 75 is not limited to the metal oxide film. For example, amorphous silicon may be used in the resistance change film 75, and an ion supply film including silver may be provided on the resistance change film 75. In this case, as a positive voltage in which the ion supply film is a positive electrode and the resistance change film 75 is a negative electrode is applied, the silver which is included in the ion supply film is ionized, moves in the resistance change film 75, forms the filament in the resistance change film 75, and degrades an electric resistance value of the resistance change film 75. In addition, as a reverse voltage is applied, the silver which forms the filament in the resistance change film 75 is ionized and moves toward the ion supply film. Accordingly, the filament is interrupted and the electric resistance value of the resistance change film 75 increases.

Figure 19:
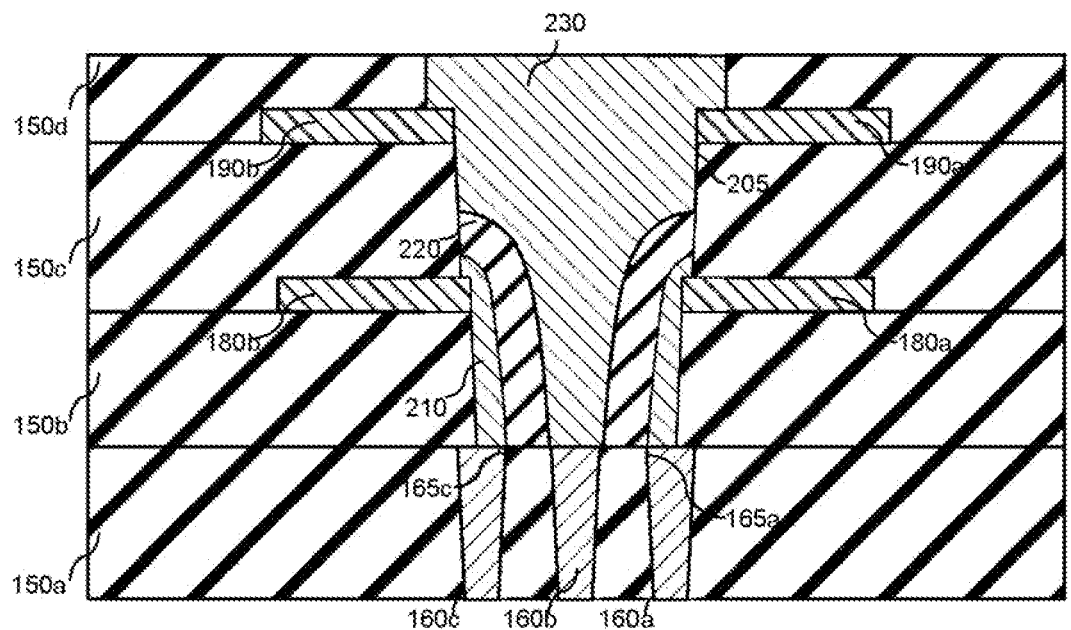
FIG. 19 is a schematic cross-sectional view illustrating a modification example of the memory device according to the first embodiment.

Furthermore, still another modification example will be described with reference to FIG. 19. FIG. 19 illustrates a case where lower layer contacts 165a, 165b, and 165c are disposed instead of the wiring layer 170. The first bit line connection unit 180 is connected to the lower layer contacts 165a and 165c, and the second bit line connection unit 190 is connected to the lower layer contact 165b. Even in this case, the first bit line BL1 and the second bit line BL2 may be drawn out to the lower layer wiring or the other circuit element via the lower layer contact 165.

Furthermore, still another modification example will be described. A case where the first bit line connection unit 180 includes the first bit line connection units 180a and 180b which are provided to be separated from each other is described, but it is not required that the first bit line connection units 180a and 180b be separated from each other. In other words, for example, the first bit line connection units 180a and 180b may be connected to each other in a tip end direction thereof, and the first void 183 may be formed in a hole shape. The similar description may be employed even in the second bit line connection unit 190.

Furthermore, another manufacturing method will be described. In the description above, a case where the first bit line connection units 180a and 180b are formed to include the first void 183 in advance is described, but the first bit line connection unit 180 may be formed without the void between the first bit line connection units 180a and 180b. In this case, when forming the contact hole 205, a region in which the first bit line connection unit 180 is processed is the first void 183. In addition, the similar description may be employed even in the second bit line connection unit 190.

In addition, the contact hole 205 generally has a taper angle (inclined angle of a contact hole side surface after forming the contact hole) which is equal to or less than 90 degrees. Since the taper angle is equal to or less than 90 degrees, the distance d2 of the second void 193 may be formed to be larger than the distance d1 of the first void.

In addition, in the description above, the bit line interconnection region is described, but the word line interconnection region may be formed in a similar manner.

Second Embodiment

Figure 20:
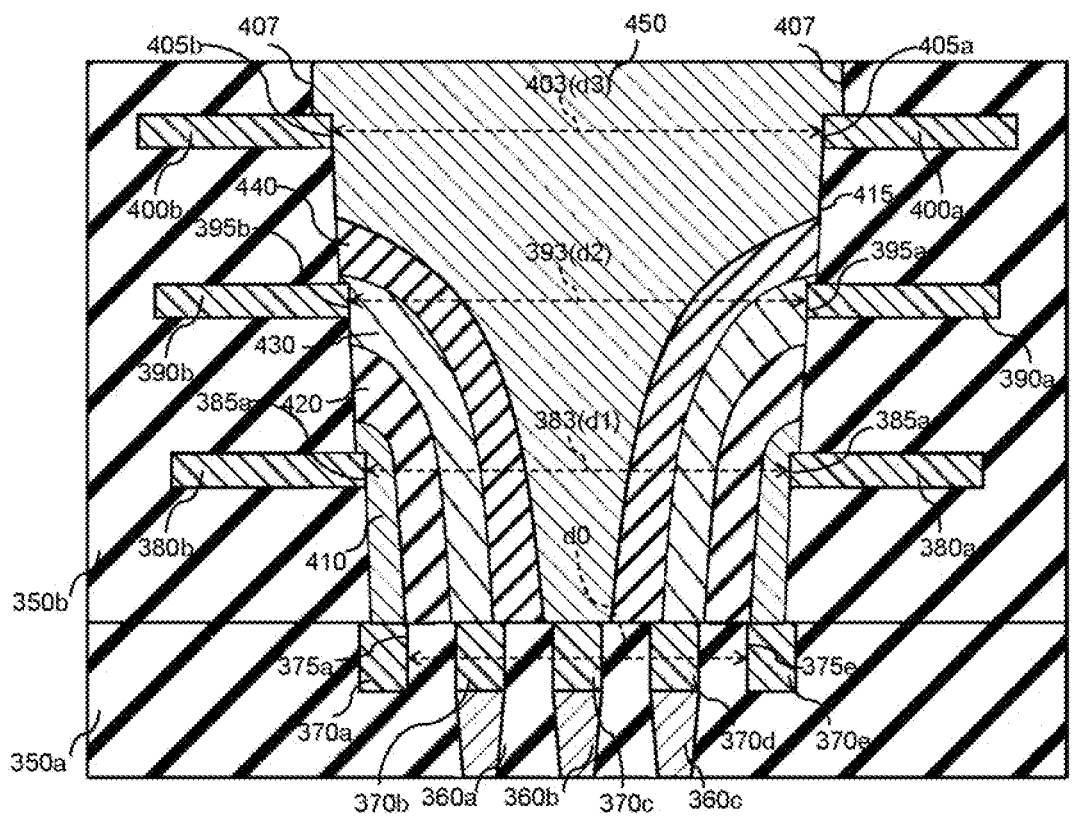
FIG. 20 is a schematic cross-sectional view illustrating a memory device according to a second embodiment.

Next, a second embodiment will be described with reference to FIG. 20. In FIG. 20, the connection units CON of the first bit line BL1, the second bit line BL2, and the third bit line BL3 are formed in the same region.

On the substrate 100 (not illustrated), lower layer contacts 360a, 360b, and 360c, and wiring layers 370a, 370b, 370c, 370d, and 370e are formed, in parallel. When they do not need to be distinguished from each other, the lower layer contacts are simply referred to as a lower layer contact 360, and the wiring layers are referred to as a wiring layer 370.

As illustrated in FIG. 20, the wiring layer 370 is formed of the wiring layers 370a, 370b, 370c, 370d, and 370e in order. Among these, the wiring layers 370b, 370c, and 370d include the lower layer contacts 360a, 360b, and 360c at lower side parts thereof. Via the lower layer contact 360, the wiring layers 370b, 370c, and 370d are drawn out to another circuit elements, such as the transistor. In addition, individual lower layer contact 360 may be provided for each of the five wiring layers 370. In addition, the wiring layers 370a and 370e may be electrically connected to each other, and the wiring layers 370b and 370d may also be electrically connected to each other. The lower layer contact 360 and the wiring layer 370 are made of a conductive material, such as tungsten or copper.

Above the wiring layer 370, the first bit line connection units 380a and 380b are formed to be separated from each other. In other words, the first bit line connection units 380a and 380b are formed to have the first void 383 therebetween. In addition, the first void 383 is formed above the wiring layer 370. In other words, when viewed from above the first void 383, the first void 383 is formed at a position which is overlapped with the wiring layer 370.

In addition, above first bit line connection units 380a and 380b, second bit line connection units 390a and 390b are formed to be separated from each other in a similar manner. In other words, the second bit line connection units 390a and 390b are formed to have a second void 393 therebetween. In addition, the second void 393 is above the first void 383, and is formed above the wiring layer 370. In other words, when viewed from above the first void 383, the second void 393 is formed at a position which is overlapped with the first void 383. In addition, when viewed from above the first void 383, the second void 393 is formed at a position which is overlapped with the wiring layer 370.

In addition, above second bit line connection units 390a and 390b, third bit line connection units 400a and 400b are formed to be separated from each other in a similar manner. In other words, the third bit line connection units 400a and 400b are formed to have a third void 403 therebetween. In addition, the third void 403 is above the first void 383 and the second void 393, and is formed above the wiring layer 370. In other words, when viewed from above the second void 393, the third void 403 is formed at a position which is overlapped with the wiring layer 370, the first void 383, and the second void 393.

In addition, the parts which are close to the first bit line connection unit 380a are the second bit line connection units 390a and the third bit line connection units 400a. The parts which are far from the first bit line connection unit 180a, in other words, the parts which are close to the first bit line connection unit 380b are the second bit line connection unit 390b and the third bit line connection unit 400b. When they do not need to be distinguished from each other, the bit line connection units are respectively called a first bit line connection unit 380, a second bit line connection unit 390, and a third bit line connection unit 400.

The first bit line connection unit 380 is an interconnection unit of the first bit line BL1, is a part of the first bit line BL1, and is formed of the same material as that of the first bit line BL1. Similarly, the second bit line connection unit 390 is an interconnection unit of the second bit line BL2, is a part of the second bit line BL2, and is formed of the same material as that of the second bit line BL2. Similarly, the third bit line connection unit 400 is an interconnection unit of the third bit line BL3, is a part of the third bit line BL3, and is formed of the same material as that of the third bit line BL3.

Between the first bit line connection units 380a and 380b, between the second bit line connection units 390a and 390b, and between the third bit line connection units 400a and 400b, a contact hole 415 is formed.

At a side part of the contact hole 415, a first side wall contact 410 is formed. The first side wall contact 410 is made of a conductive material, and electrically connects the first bit line connection unit 380 and the wiring layers 370a and 370e to each other. The first side wall contact 410 is made of tungsten, copper or the like.

A first spacer insulation unit 420 is formed to cover the first side wall contact 410 on the inner side of the contact hole 415. The first spacer insulation unit 420 is made of an insulation body, and insulates the first side wall contact 410 and a second side wall contact 430. The first spacer insulation unit 420 is made of, for example, the silicon oxide film.

The second side wall contact 430 is formed on the inner side of the contact hole 415 and on the inner side where the first spacer insulation unit 420 is formed. The second side wall contact 430 is made of a conductive material, and electrically connects the second bit line connection unit 390 and the wiring layers 370b and 370d to each other. The second side wall contact 430 is made of tungsten, copper or the like.

A second spacer insulation unit 440 is formed to cover the second side wall contact 430 on the inner side of the contact hole 415. A second spacer insulation unit 440 uses an insulator, and insulates the second side wall contact 430 and the center contact 450. The second spacer insulation unit 440 is made of, for example, the silicon oxide film.

The center contact 450 is formed on the inner side of the contact hole 415 and on the inner side of the second spacer insulation unit 440. The center contact 450 is made of conductive material, and electrically connects the third bit line connection unit 400 and the wiring layer 370c to each other. The center contact 450 is made of tungsten, copper or the like.

In addition, for convenience of description, hereinafter, terms will be described.

First, a boundary 407 is a boundary between the center contact 450 of an upper side part of the contact hole 415 and an interlayer insulation film 350b.

Next, end parts 385a and 385b are inside the contact hole 415, and are referred to as end parts which faces the first bit line connection units 380a and 380b, respectively. End parts 395a and 395b are inside the contact hole 415, and are referred to as end parts which faces the second bit line connection units 390a and 390b, respectively. Boundaries 407a and 407b are inside the contact hole 415, and are referred to as end parts which faces the third bit line connection units 400a and 400b, respectively. An end part 375a is provided below the contact hole 415, and is referred to as an end part near a wiring layer 370b in the wiring layer 370a. An end part 375e is provided below the contact hole 415, and is referred to as an end part 370d near a wiring layer 370e.

Hereinafter, in particular, when they do not need to be distinguished from each other, the end parts 385a and 385b are referred to as an end part 385, the end parts 395a and 395b are referred to as an end part 395, the boundaries 407a and 407b are referred to as a boundary 407, and the end parts 375a and 375e are referred to as an end part 375.

Furthermore, a distance d0 represents a distance on an upper end side in particular between the wiring layers 370a and 370e, a distance d1 represents a distance between the first bit line connection units 380a and 380b, a distance d2 represents a distance between the second bit line connection units 390a and 390b, and a distance d3 represents a distance between the third bit line connection units 400a and 400b.

Next, by using the above-described terms, a desired relationship of each of the structural will be described in a case of forming the contact hole 415, the first side wall contact 410, the second side wall contact 430, or the center contact 450 in self-alignment.

In other words, (1) it is desirable that a part of the boundary 407 be formed above the third bit line connection unit 400. (2) It is desirable that the boundary 407 be formed on the second bit line connection unit 390. (3) It is desirable that the end part 395 be formed on the first bit line connection unit 380. (4) It is desirable that the end part 385 be formed in the outer side direction of the end part 375. (5) It is desirable that the distance d3 be larger than the distance d2, the distance d2 be larger than the distance d1, and the distance d1 be larger than the distance do.

The contact hole 415, the first side wall contact 410, the second side wall contact 430, the center contact 450, or the like may be partially formed in self-alignment. Therefore, it is not required that the above-described relationship be valid in the entire region in which the contact hole 415 is formed. It is sufficient if the above-described relationship is valid at a part of the region in which the contact hole 415 is formed. This is because the contact hole 415, the first side wall contact 410, the second side wall contact 430, and the center contact 450 may be formed at a part in which the above-described relationship is partially valid. In addition, it is not necessarily required that the relationship of distances in (4) be valid in a case where the structural are partially formed.

Hereinafter, a method of manufacturing the memory device according to the second embodiment will be described with reference to FIGS. 21 to 29. In addition, since there are many processes of forming the device similarly to the first embodiment, the description of the process in which the same formation is performed will be appropriately omitted.

Figure 21:
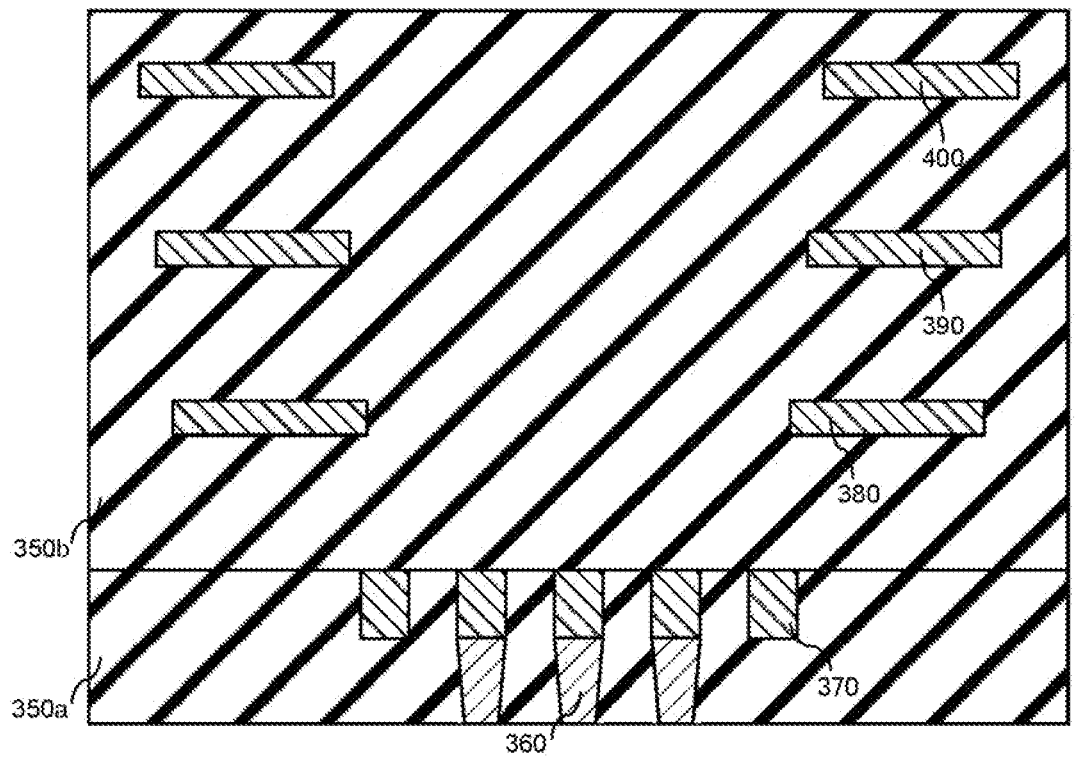
FIG. 21 is a schematic cross-sectional view illustrating a step in the method of manufacturing the memory device according to the second embodiment.

First, as illustrated in FIG. 21, the circuit element (not illustrated), such as the transistor, is formed on the substrate 100 (not illustrated). Next, an interlayer insulation layer 350a is formed on the substrate 100. The interlayer insulation layer 350a is, for example, a silicon oxide film.

On an upper layer of the interlayer insulation layer 350a, the lower layer contact 360 and the wiring layer 370 are formed. The lower layer contact 360 or the wiring layer 370 is made of, for example, the barrier metal film and the metal film.

Next, the first bit line connection unit 380, the second bit line connection unit 390, the third bit line connection unit 400, and the interlayer insulation film 350b are formed. In the middle of the process, as necessary, flattening is performed by the CMP.

Figure 22:
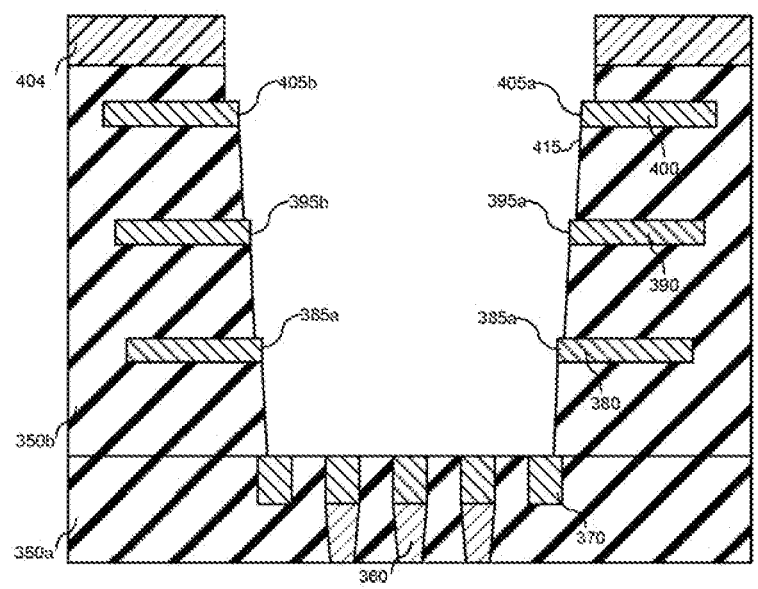
FIG. 22 is a schematic cross-sectional view illustrating a step in the method of manufacturing the memory device according to the second embodiment.

Next, as illustrated in FIG. 22, by the lithography method, a mask pattern 404 is formed on the interlayer insulation film 350b. By using the mask pattern 404 as the mask, the etching process is performed by the RIE method or the like. By this etching process, the contact hole 415 is formed. This state is illustrated in FIG. 22. In addition, in practice, the interlayer insulation layer 350a is also etched to a certain extent by the above-described etching process, but the description thereof will be omitted in FIG. 22.

It is desirable that the mask pattern be formed so that the boundary 407 of the interlayer insulation film 350b on the third bit line connection unit 400 is formed above the third bit line connection unit 400 after the etching process.

In addition, the above-described etching uses an etching condition in which an etching speed of the interlayer insulation films 350a to 350b is fast with respect to an etching speed of the first bit line connection unit 380, the second bit line connection unit 390, and the third bit line connection unit 400, similarly to the first embodiment.

When selecting such etching conditions, similarly to the first embodiment, by a structure which has been already formed, such as the first bit line connection unit 380, the second bit line connection unit 390, and the third bit line connection unit 400, the contact hole 415 is formed in a continuous shape in self-alignment.

Figure 23:
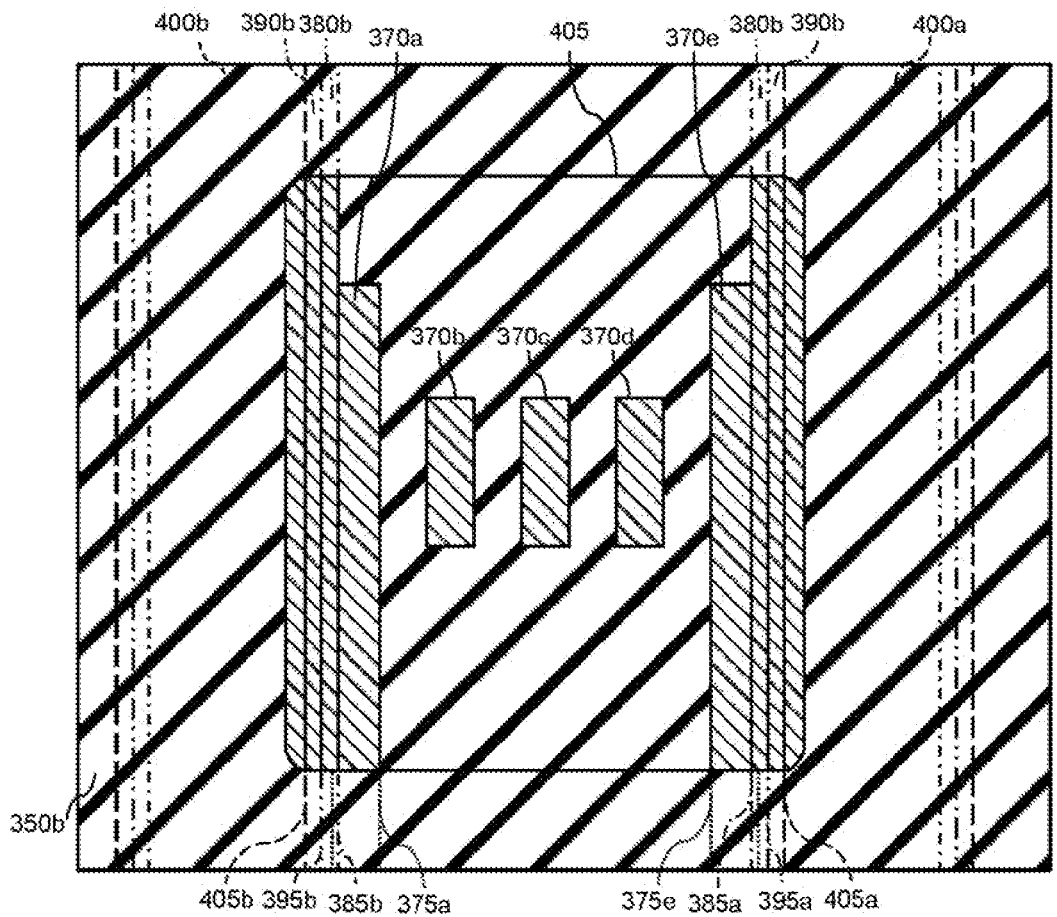
FIG. 23 is a schematic plan view illustrating a step in the method of manufacturing the memory device according to the second embodiment.

A plan view after the contact hole 415 is formed is illustrated in FIG. 23. In addition, in FIG. 23, the wiring layer 370 below the interlayer insulation film 350b, the first bit line connection unit 380, the second bit line connection unit 390, and the third bit line connection unit 400 are illustrated by dotted lines.

As illustrated in FIG. 23, the wiring layer 370, the first bit line connection unit 380, the second bit line connection unit 390, and the third bit line connection unit 400 are exposed to the inside of the contact hole 415. In addition, 370a and 370e of both ends of the wiring layer 370 are drawn out to the lower side in the drawing.

Figure 24:
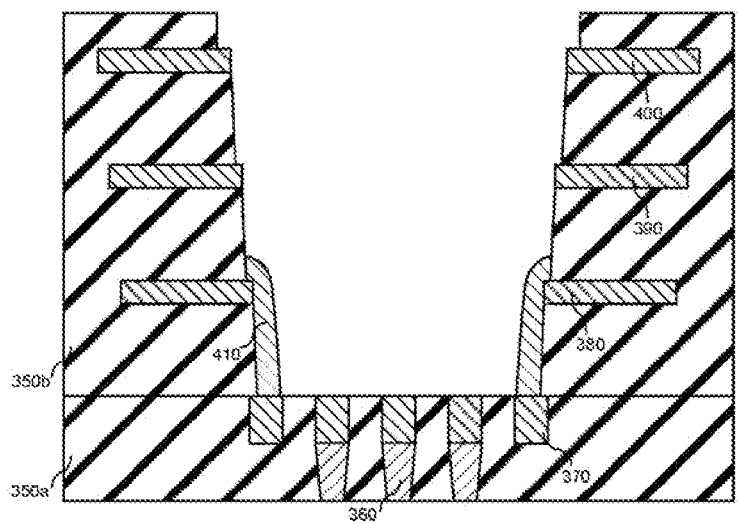
FIG. 24 is a schematic cross-sectional view illustrating a step in the method of manufacturing the memory device according to the second embodiment.

Next, as illustrated in FIG. 24, the first side wall contact 410 is formed. The first side wall contact material is formed as the entire surface is etched back by the RIE. The forming method and the material of the first side wall contact are similar to the method of forming the side wall contact 210 in the first embodiment, which is illustrated in FIGS. 12 and 13.

Figure 25:
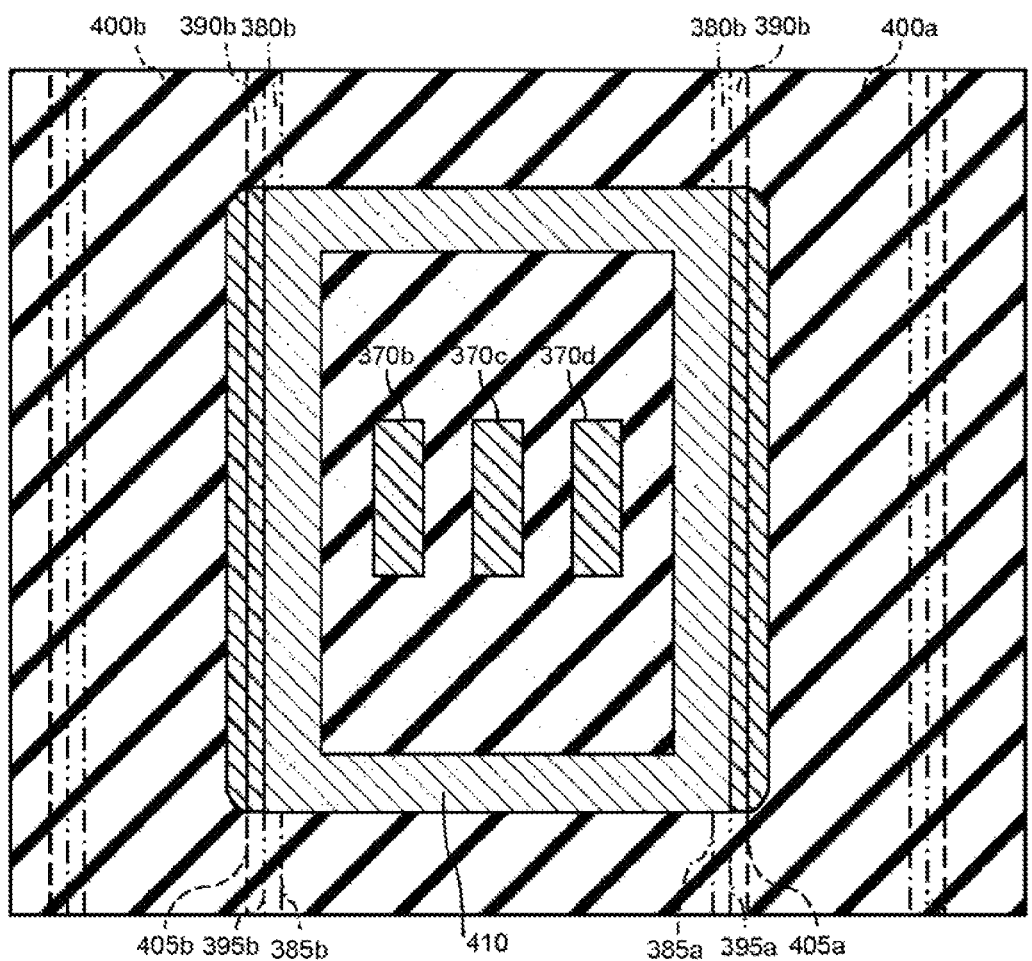
FIG. 25 is a schematic plan view illustrating a step in the method of manufacturing the memory device according to the second embodiment.

In addition, a plan view of this state is illustrated in FIG. 25. In addition, in FIG. 25, the first bit line connection unit 380, the second bit line connection unit 390, and the third bit line connection unit 400 below the interlayer insulation film 350b are illustrated by dotted lines.

Figure 26:
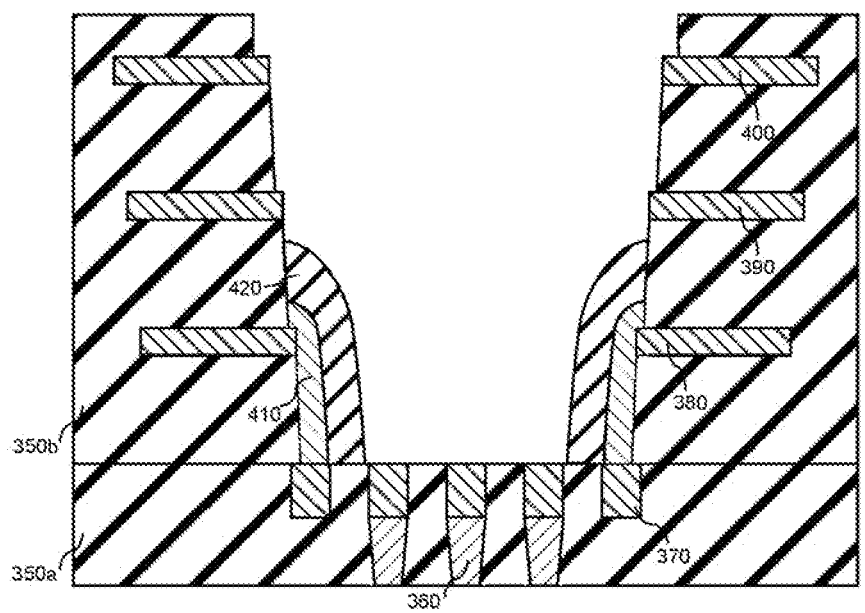
FIG. 26 is a schematic cross-sectional view illustrating a step in the method of manufacturing the memory device according to the second embodiment.

Next, as illustrated in FIG. 26, the first spacer insulation unit 420 is formed. The first spacer insulation material is formed as the entire surface is etched back by the RIE. The forming method and the material of the first spacer insulation unit 420 are similar to the method of forming the spacer insulation unit 220 in the first embodiment, which is illustrated in FIGS. 15 and 16.

Figure 27:
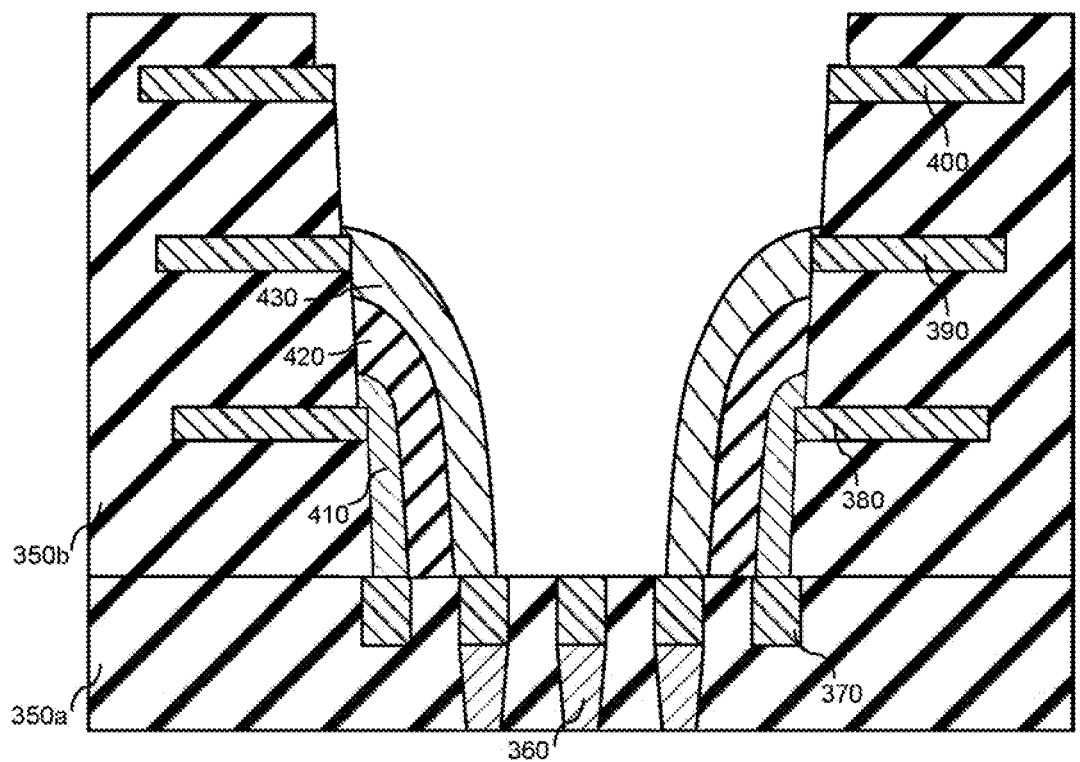
FIG. 27 is a schematic cross-sectional view illustrating a step in the method of manufacturing the memory device according to the second embodiment.
Figure 28:
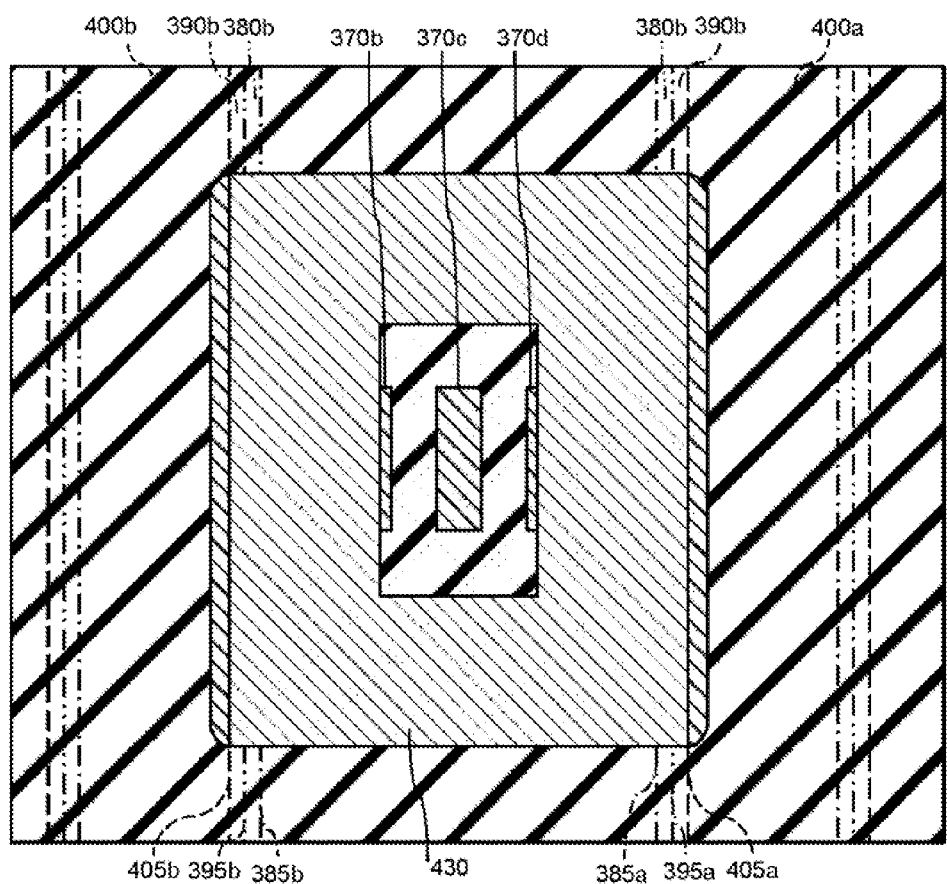
FIG. 28 is a schematic plan view illustrating a step in the method of manufacturing the memory device according to the second embodiment.

Next, as illustrated in FIG. 27, the second side wall contact 430 is formed. Similarly to the first side wall contact 410, the second side wall contact 430 may also be formed by etching back after the second side wall contact material is formed. The same material as the lower layer contact material may be used. A plan view of this state is illustrated in FIG. 28. In addition, in FIG. 28, the first bit line connection unit 380, the second bit line connection unit 390, and the third bit line connection unit 400 below the interlayer insulation film 350b are illustrated by the dotted lines.

In addition, by etching back, the second side wall contact material is removed so that at least a part of a region which is in contact with the third bit line connection unit 400, a side wall of the interlayer insulation film 350b above the third bit line connection unit 400, and a region in which the wiring layer 370c is exposed to the inside of the contact hole 205, is exposed. In addition, at least at a part of a region in which the second bit line connection unit 390 is exposed to the inside of the contact hole 415, the etching back is performed so that the second side wall contact material remains. As illustrated in FIG. 27, it is desirable that the side wall contact material remain to cover the region in which the second bit line connection unit 390 is exposed to the inside of the contact hole 415.

Next, as illustrated in FIG. 20, the second spacer insulation unit 440 and the center contact 450 are formed. After the second spacer insulation material is formed, the second spacer insulation unit 440 is formed as the entire surface thereof is etched back by the RIE. In order to insulate the second side wall contact 430 and the center contact 450 which is formed later, by etching back, the second spacer insulation material remains to cover the second side wall contact 430. After forming the center contact material, the center contact 450 is formed as the entire surface thereof is etched back by the RIE.

Hereinafter, by the standard manufacturing method, the memory device according to the embodiment is manufactured.

In the memory device according to the embodiment, by providing the connection unit CON, with respect to each of the first bit line BL1, the second bit line BL2, and the third bit line BL3 in the same region, it is possible to form the contact to each of the different circuit elements. As compared to a case where the connection units of each bit line BL are separately formed, it is possible to reduce the area required for the connection unit, and to reduce the area of the memory device.

It is possible to obtain similar effects to those of the first embodiment, such as the manufacture of the device with a reduced number of processes or improved manufacturing yield.

While the first embodiment is directed to the connection unit CON with respect to the two bit lines, such as the first bit line BL1 and the second bit line BL2, in this embodiment, it is possible to form the connection unit CON with respect to the three bit lines, such as the first bit line BL1, the second bit line BL2, and the third bit line BL3. Accordingly, as compared to the first embodiment, it is possible to manufacture the device with less number of processes and better yield.

Hereinafter, a modification example of the second embodiment will be described. In addition, in FIGS. 29 and 30 used in the description below, the first bit line connection unit 380, the second bit line connection unit 390, and the third bit line connection unit 400 below the interlayer insulation film 350b, are illustrated by dotted lines.

Figure 29:
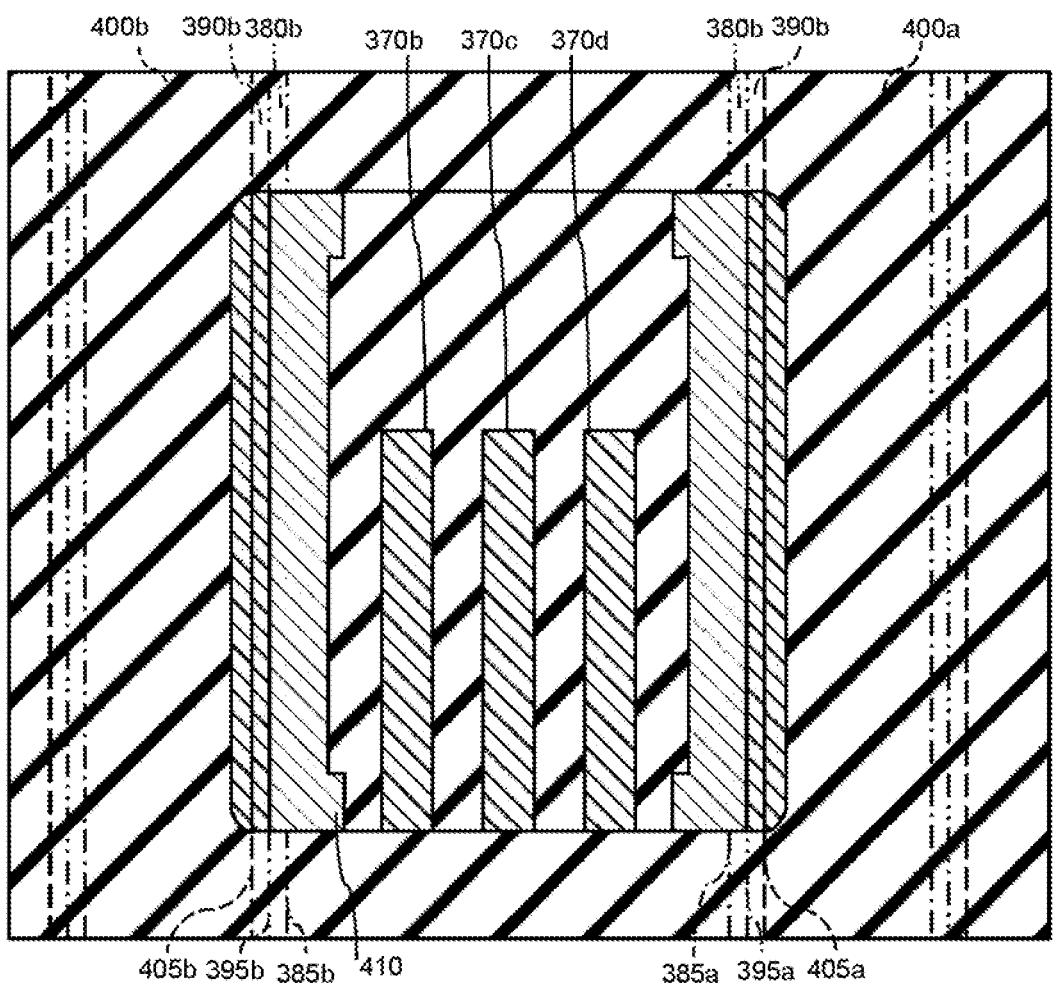
FIG. 29 is a schematic plan view illustrating a modification example of the memory device according to the second embodiment.

As a modification example of the first embodiment, it is possible to similarly modify the description in FIG. 18. In other words, as illustrated in FIG. 29, after a first side wall contact 310 is formed, the first side wall contact 310 is divided into two on the first bit line connection units 380a and 380b sides. In other words, in the first side wall contact 410, a part of a region in which the first side wall contact 410 is not formed along the first bit line connection unit 380 and the second bit line connection unit 390 is removed. In addition, the above-described division forms a mask by the lithography method, for example, and may perform etching by the RIE method.

Figure 30:
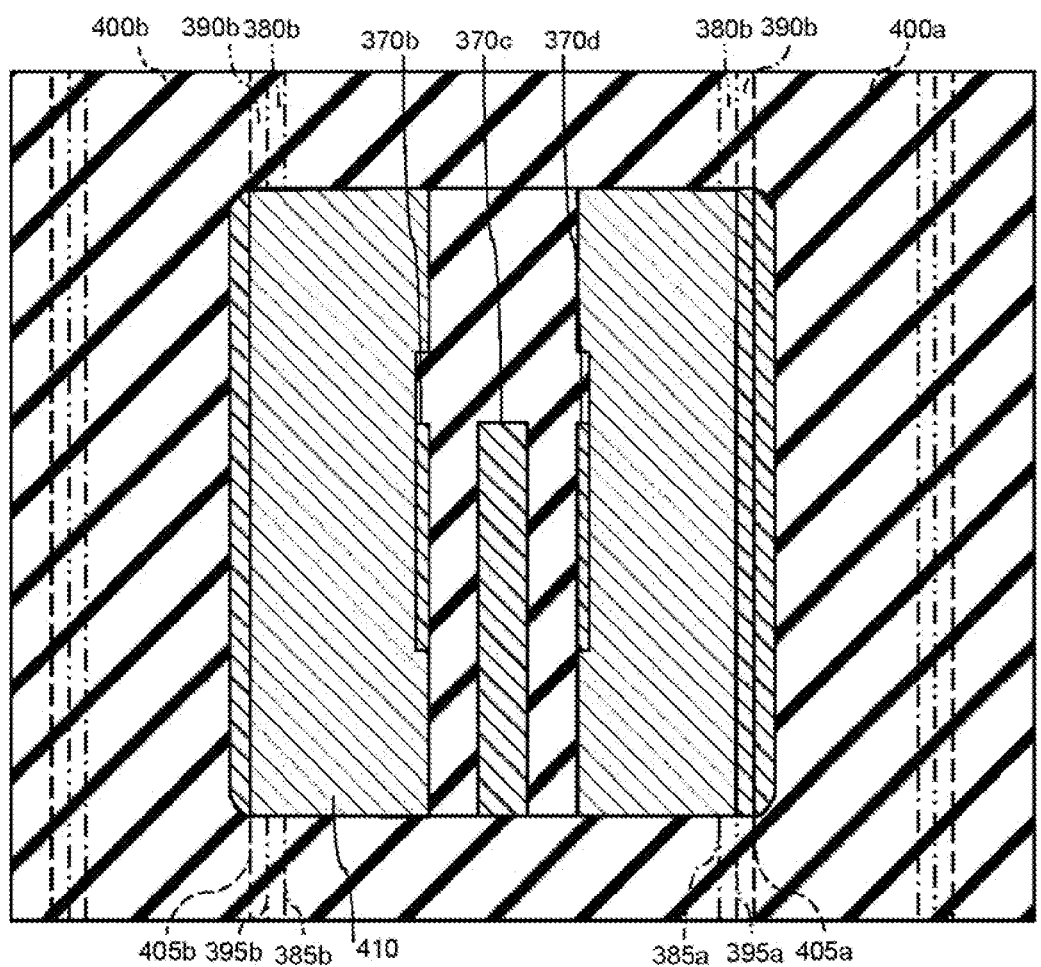
FIG. 30 is a schematic plan view illustrating another modification example of the memory device according to the second embodiment.

Similarly, as illustrated in FIG. 30, after the second side wall contact 430 is formed, the second side wall contact 430 is divided into two on the second bit line connection units 390a and 390b sides. In other words, in the second side wall contact 430, a part of a region in which the second side wall contact 430 is not formed along the second bit line connection unit 390 is removed.

Accordingly, with respect to the wiring layers 370b, 370c, and 370d, without the lower layer contact 360, it is possible to draw out the wiring layers 370b, 370c, and 370d to the other circuit element or the like.

Another modification example will be described. An example in which there are five wiring layers 370 is illustrated in FIG. 20, but three wiring layers 370 may be provided. For example, only the wiring layers 370a, 370b, and 370c may be provided. In this case, the first bit line BL1 is drawn out to the wiring layer 370a, the second bit line BL2 is drawn out to the wiring layer 370b, and the third bit line BL3 is drawn out to the wiring layer 370c.

Furthermore, still another modification example will be described.

In the first embodiment, the connection units CON with respect to the two bit lines are described, and in the second embodiment, the connection units CON with respect to the three bit lines are described. However, the embodiments are not limited thereto. In other words, it is possible to form the connection units CON of an arbitrary number of bit lines.

For example, with respect to the second embodiment, before forming the center contact, as the arbitrary number of the spacer insulation units and the side wall contacts are provided, it is possible to form the connection unit CON with respect to the number of the arbitrary bit lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a substrate;
   first and second wirings above the substrate;
   a third wiring above the first and second wirings;
   a fourth wiring above the third wiring;
   a first contact electrically connected between the first wiring and the fourth wiring;
   a first insulator on the first contact; and
   a second contact on the first insulator, the second contact being electrically connected between the second wiring and the third wiring,
   wherein the first contact overlaps the second contact in a direction that is orthogonal to an upper surface of the substrate, and wherein a width of the first contact adjacent to the fourth wiring is greater than a width of the second contact adjacent to the third wiring.

2. The device according to claim 1, wherein the second contact overlaps at least a part of the second wiring in the direction that is orthogonal to the upper surface of the substrate.

3. The device according to claim 1, further comprising:
   a third contact below the first wiring and electrically connected to the first wiring.

4. The device according to claim 1, further comprising:
   a fifth wiring at the same level as the first and second wirings;
   a sixth wiring above the first, second, and fifth wirings and below the third wiring; and
   a fourth contact electrically insulated from the first and second contacts and electrically connected between the fifth and sixth wirings.

5. The device according to claim 4, wherein the first contact overlaps the second and fourth contacts in the direction that is orthogonal to the upper surface of the substrate, and the second contact overlaps the fourth contact in the direction that is orthogonal to the upper surface of the substrate.

6. A memory device, comprising:
   a substrate;
   a first wiring above the substrate;
   second wirings above the substrate adjacent to the first wiring;
   third wirings above the first and second wirings;
   fourth wirings above the third wirings;
   a first contact electrically connected between the first wiring and the fourth wirings;
   a first insulator on the first contact; and
   a second contact on the first insulator, the second contact being electrically connected between the second wirings and the third wirings,
   wherein the first contact overlaps the second contact in a direction that is orthogonal to an upper surface of the substrate.

7. The device according to claim 6, wherein a distance between the fourth wirings is greater than a distance between the third wirings.

8. The device according to claim 6, wherein a width of the first contact between the fourth wirings is greater than a width of the first contact between the third wirings.

9. The device according to claim 6, wherein a width of the first contact between the third wirings is greater than a width of the first contact adjacent to the first wiring.

10. The device according to claim 6, wherein the second contact overlaps at least a part of the second wiring in the direction that is orthogonal to the upper surface of the substrate.

11. The device according to claim 6, further comprising:
    a third contact below the first wiring and electrically connected to the first wiring.

* * * * *